(12) United States Patent
Beintner et al.

(10) Patent No.: US 6,566,228 B1
(45) Date of Patent: May 20, 2003

(54) TRENCH ISOLATION PROCESSES USING POLYSILICON-ASSISTED FILL

(75) Inventors: Jochen Beintner, Wappingers Falls, NY (US); Rama Divakaruni, Ossining, NY (US); Jack A. Mandelman, Stormville, NY (US); Andreas Knorr, Fishkill, NY (US)

(73) Assignees: International Business Machines Corporation, Armonk, NY (US); Infineon Technologies, Munich (DE)

( * ) Notice: Subject to any disclaimer, the term of this patent is extended or adjusted under 35 U.S.C. 154(b) by 0 days.

(21) Appl. No.: 10/083,744

(22) Filed: Feb. 26, 2002

(51) Int. Cl.$^7$ ............................................. H01L 21/76
(52) U.S. Cl. ...................................................... 438/430
(58) Field of Search ................................. 438/222, 360, 438/429, 430

(56) References Cited

U.S. PATENT DOCUMENTS

| | | | | |
|---|---|---|---|---|
| 5,716,868 A | * | 2/1998 | Nagai | 438/430 |
| 6,251,734 B1 | * | 6/2001 | Grivna et al. | 438/296 |
| 6,277,707 B1 | * | 8/2001 | Lee et al. | 438/430 |
| 6,277,709 B1 | * | 8/2001 | Wang et al. | 438/430 |
| 6,306,723 B1 | * | 10/2001 | Chen et al. | 438/429 |

* cited by examiner

*Primary Examiner*—Olik Chaudhuri
*Assistant Examiner*—David Blum
(74) *Attorney, Agent, or Firm*—F. Chau & Associates, LLP

(57) ABSTRACT

Disclosed is a method of simultaneously supplying trench isolations for array and support areas of a semiconductor substrate made of a substrate material, the method comprising providing a first hard mask layer for the array and support areas, said first hard mask comprising mask openings defining trench isolations in the array and support areas, providing deep array trench isolations in the array areas, providing a blanketing planarized conductive material layer over both support and array areas sufficient to fill said mask openings and deep array trench isolations, etching said conductive material through said first hard mask material down into said semiconductor substrate so as to form support trench isolations, such that both deep array trench isolations and support trench isolations are of equal depth, and wherein a conductive element, comprising a quantity of said conductive material, remains in the bottom of each of said deep array trenches.

20 Claims, 21 Drawing Sheets

- STI liner

- Oxide RIE

- Poly recess and support IT etch (one step)

- Oxide hardmask #2 strip

- STI liner

- Poly planarization

- Poly recess and IT etch support

- Oxide hardmask #2 strip

Figure 28
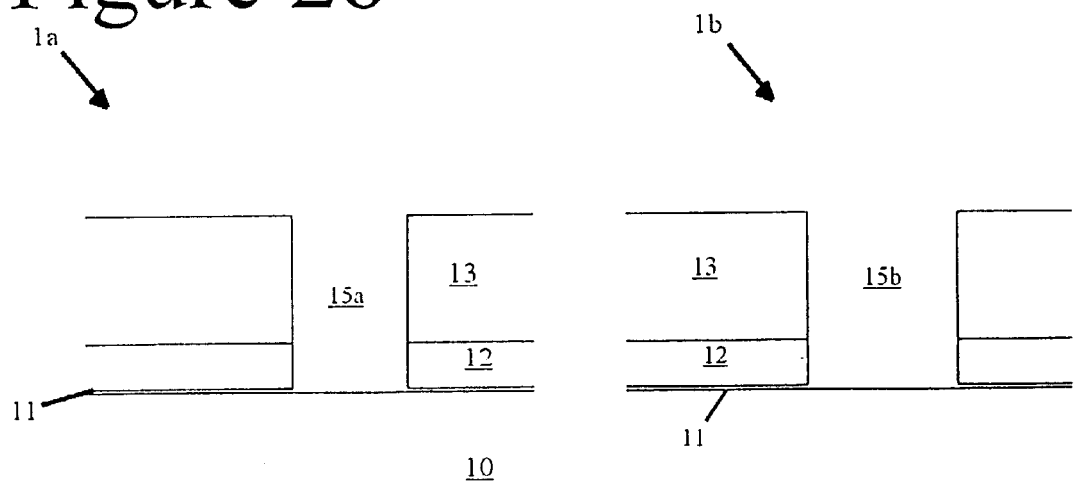
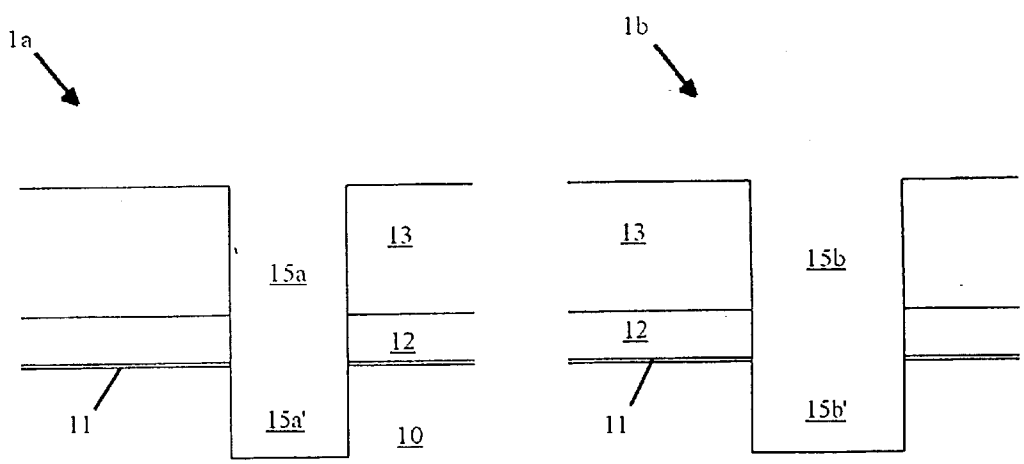
Figure 29

TRENCH ISOLATION PROCESSES USING POLYSILICON-ASSISTED FILL

BACKGROUND OF THE INVENTION

1. Field of the Invention

This invention relates to the fabrication of trench isolations on a semiconductor substrate using polysilicon-assisted fill both with and without a field shield isolation.

2. Discussion of the Related Art

An objective of the semiconductor art is to continually scale down densely packed devices on a semiconductor substrate so as to reduce size and power consumption of the integrated circuits. Devices packed closely together are generally isolated from one another with trench isolations so as to prevent dopants of the active area of one device from migrating to adjacent devices and to avoid parasitic electrical conduction between active areas.

In the art of memory devices, such as in U.S. Pat. No. 5,525,531, issued Jun. 11, 1996, it is known to insert a conductor within a trench isolation for use as a field shield. Memory devices, such as RAMS, DRAMS, and the like, generally comprise an array area and a support area. The array area contains the memory cells and the support area contains the supporting devices required to control addressing of and data transfer into and out of the memory cells. Both areas need trench isolations, but of a different sort. Array devices may be executed as vertical devices, so as to save space. Trenches in the array area need to be deeper, so called "deep isolation trenches", than those in the support area to protect the vertical devices from one another and to provide enough room for the insertion conductive material that will comprise the field shields. This is because the vertical device will typically be longer than planar devices in the vertical direction by as much as 350 nm. Isolation trenches under these circumstances will be etched deeper than the bottom source/drain contact for isolation. The support trenches have no conductive material inserted at all. Hence, the trenches of the array and support areas are different, but will be formed at substantially the same levels.

Typically, the different trenches of the array and support areas are fabricated by masking off one area while the trenches of the other are built, but this is a time and resource consuming process. It is desirable to utilize a process wherein most of the process steps are executed simultaneously on both the array and support areas, thereby saving manufacturing time and resources.

SUMMARY OF THE INVENTION

Disclosed is a method of simultaneously supplying trench isolations for array and support areas of a semiconductor substrate made of a substrate material, the method comprising providing a first hard mask layer for the array and support areas, said first hard mask comprising mask openings defining trench isolations in the array and support areas, providing deep array trench isolations in the array areas, providing a blanketing planarized conductive material layer over both support and array areas sufficient to fill said mask openings and deep array trench isolations, etching said conductive material through said first hard mask material down into said semiconductor substrate so as to form support trench isolations, such that both deep array trench isolations and support trench isolations are of equal depth, and wherein a conductive element, comprising a quantity of said conductive material, remains in the bottom of each of said deep array trenches.

In another aspect of the method, said substrate material is silicon and said conductive material is polysilicon.

In another aspect of the method, said array area comprises vertical devices.

In another aspect of the method, said conductive element is in electrical contact with said semiconductor substrate.

In another aspect of the method, said conductive element is insulated from said semiconductor substrate.

In another aspect of the method, an electrical contact is provided to said conductive element.

Another aspect of the method further comprises providing an oxide insulator upon inner surfaces of said deep array trench isolations prior to providing said blanketing layer of conductive material.

Another aspect of the method further comprises providing an additional oxide insulator upon inner surfaces defined by said deep array trench isolations.

In another aspect of the method, said conductive element is a field shield.

In another aspect of the method, said field shield is biased.

Disclosed is a method of simultaneously supplying trench isolations for array and support areas of a semiconductor substrate made of a substrate material, the method comprising providing deep array trench isolations in the array areas and support trench isolations in the support areas, providing an oxide plug within said deep array trench isolations, filling said support trench isolations with oxide, providing a blanketing planarized conductive material layer over both support and array areas sufficient to fill said array and deep array trench isolations, planarizing said conductive material layer to a level substantially equal to said oxide mask, etching said conductive material through said oxide mask material down into said semiconductor substrate so as to bring an upper surface of said conductive material within said deep trench isolations to a level below that of an upper surface of said oxide in said support trench isolations, and wherein a conductive element, comprising a quantity of said conductive material, remains in the bottom of each of said deep array trenches.

In another aspect of the method, said substrate material is silicon and said conductive material is polysilicon.

In another aspect of the method, said array area comprises vertical devices.

In another aspect of the method, said steps of providing an oxide plug within said deep array trench isolations and filling said support trench isolations with oxide is performed by a method comprising the steps of depositing a conformal layer of oxide over said array and support areas of sufficient depth to fill said support trench isolations, and etching back said conformal oxide layer to an extent effective in providing said oxide plug.

In another aspect of the method, said conductive element is insulated from said semiconductor substrate.

In another aspect of the method, an electrical contact is provided to said conductive element.

Another aspect of the method further comprises providing an oxide insulator upon inner surfaces of said deep array trench isolations prior to providing said blanketing layer of conductive material.

Another aspect of the method further comprises providing an oxide insulator upon inner surfaces of said deep array trench isolations prior to providing said conformal oxide layer.

In another aspect of the method, said conductive element is a field shield.

In another aspect of the method, said field shield is biased.

BRIEF DESCRIPTION OF THE DRAWINGS

FIG. 28 shows in cross-section a starting substrate for use with another embodiment of the invention.

FIGS. 29 through 30 show preparatory steps for a second set of embodiments of the invention wherein the processing of array areas differs from that of support areas.

DETAILED DESCRIPTION OF THE PREFERRED EMBODIMENTS

Figure 1:
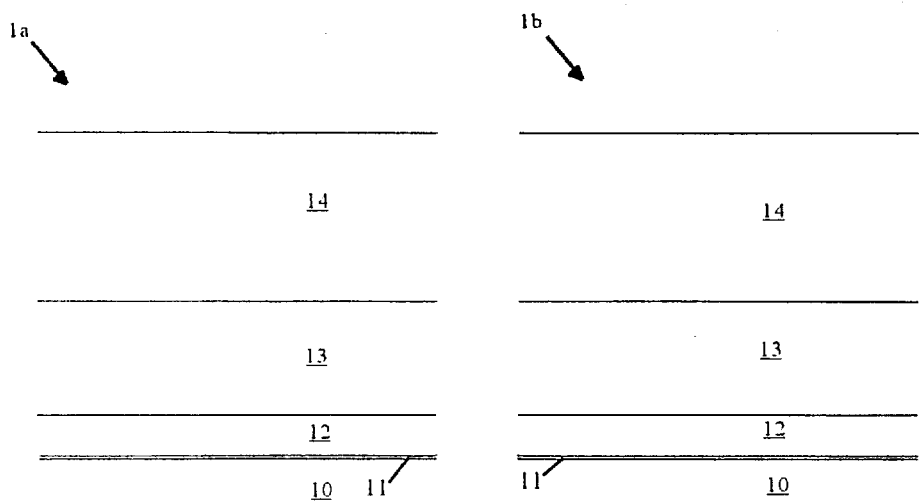
FIG. 1 shows a cross-sectional view of an array and support starting structures.

Referring to FIG. 1, there is shown in cross section an array substrate area 1a comprising memory cells and a support area 1b comprising supporting circuitry on a semiconductor substrate 1 of a semiconductor memory, such as a PROM, DRAM, EPROM, EDRAM, and the like. The figures show a typical early stage of manufacture where both the array and support areas are identical. Typically, the chip is prepared by growing a pad oxide 11 layer upon a silicon substrate 10. On top of the pad oxide layer 11 there is deposited a pad nitride 12, a first oxide hard mask 13 (e.g., TEOS or LPTEOS), and a second oxide hard mask 14 (e.g., a boron silicate glass, or BSG).

Figure 2:
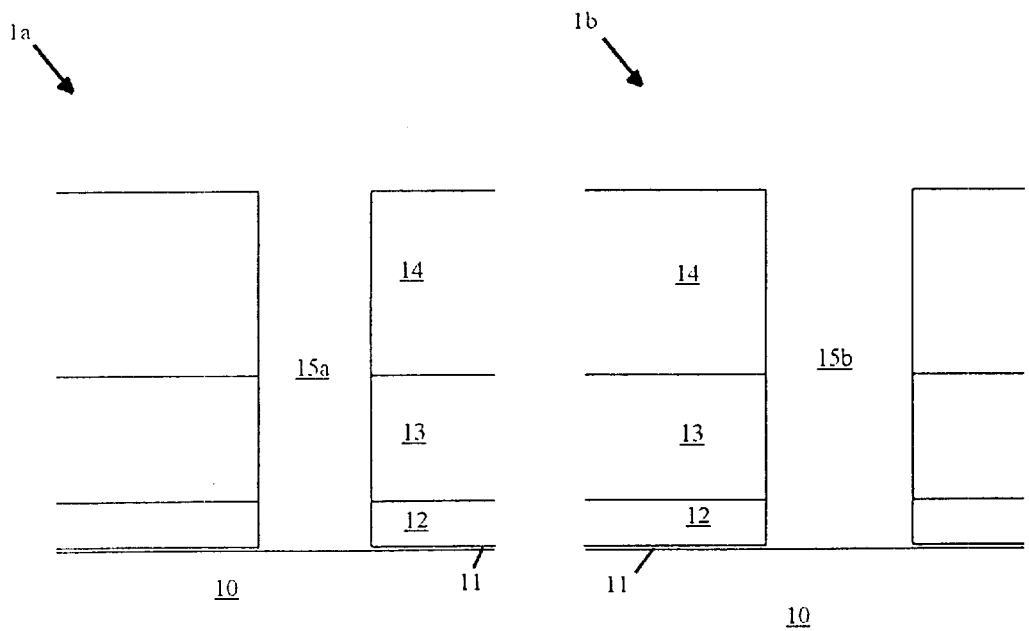
FIGS. 2 through 5 show preparatory steps for a first set of embodiments of the invention wherein the processing of array areas differs from that of support areas.

Referring to FIG. 2, array and support mask openings 15a and 15b are etched into the array and support areas, 1a, 1b, usually by lithography and plasma reactive ion etch (RIE). These mask opening define the locations and dimensions of the isolation trenches that will be etched into the substrate below the pad nitride layer in later steps. Commercially available RIE systems for use in the invention include those sold under the "Etch Centura" tradename series by Applied Materials, among others. Such systems utilize a glow discharge and electrodes to combine the benefits of sputtering with those of enhanced plasma etching and to produce highly anisotropic etches. The etches will preferable penetrate the pad oxide 11 all the way down to the substrate 10.

Figure 3:
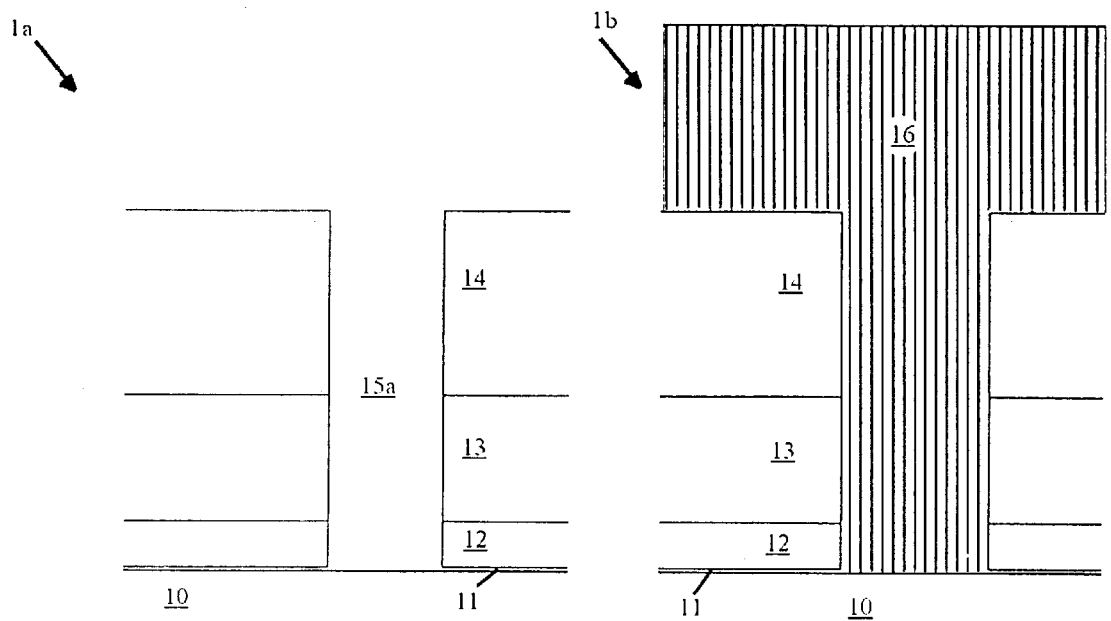

Referring to FIG. 3, an MUV (mid-ultraviolet) photoresist 16 is patterned to protect the support area 1b as a block mask.

Figure 4:
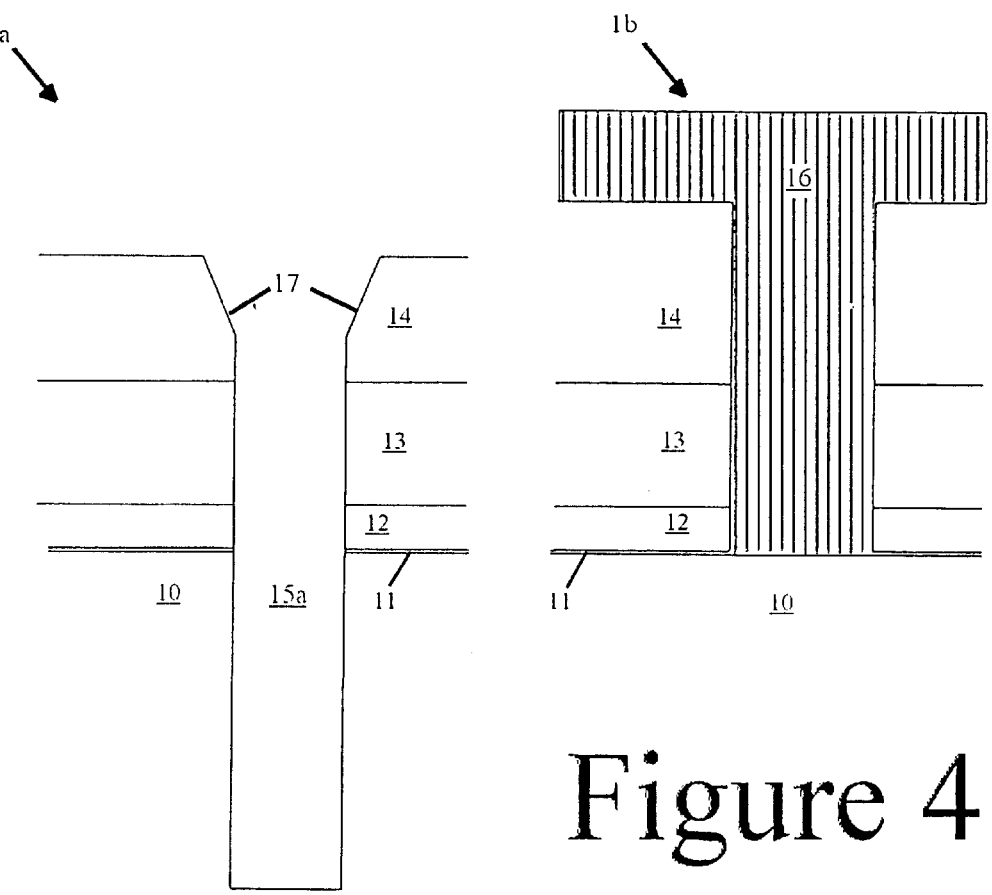

Referring to FIG. 4, the array isolation trenches 15a' are deep etched by RIE through the pad oxide layer 11 and into the silicon substrate 10. The depth of these trenches will vary according to need, but will generally be from 400 nanometers to 1000 nanometers deep below the silicon surface, about two to five times the depth of the support trenches 15b' (not shown in this Figure). Note that the deep etch will cause faceting 17 of the second oxide layer 14 because of the erosion of the masking material by the RIE.

Figure 5:
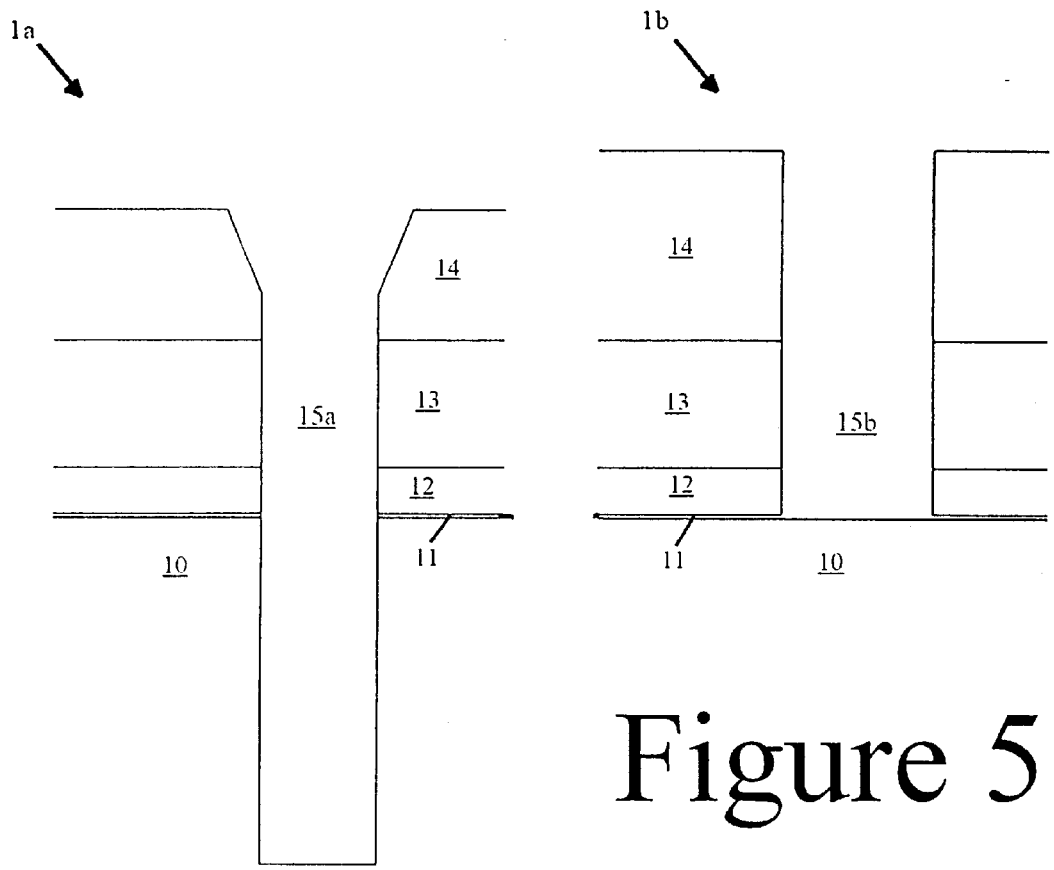

Referring to FIG. 5, the photoresist is removed, thereby resulting in a structure wherein only deep array trenches are provided. Organic polymers may be etched by almost any plasma process containing high concentrations of oxygen gas. Oxygen plasmas are especially selective with respect to polysilicon, silicon oxide, and aluminum structures and will therefore leave such structures unharmed. The addition of fluorine-containing gases, such as $CF_4$ or $CHF_3$, $CH_2F_2$, or $CH_3F$, will significantly increase the etch rate, though also cause etching of any silicon nitride structures present.

The process steps described with respect to FIGS. 3 through 5 are the only steps of the invention that differ between the array and support areas, with the exception that, in an embodiment wherein a field shield element is inserted into the deep trench, it will be necessary at the end of the process to connect a conductor to it. Other than that exception, the remaining process steps are executed upon both the array and support trenches 15a', 15b' simultaneously through both the array and support mask openings 15a, 15b.

Figure 6:
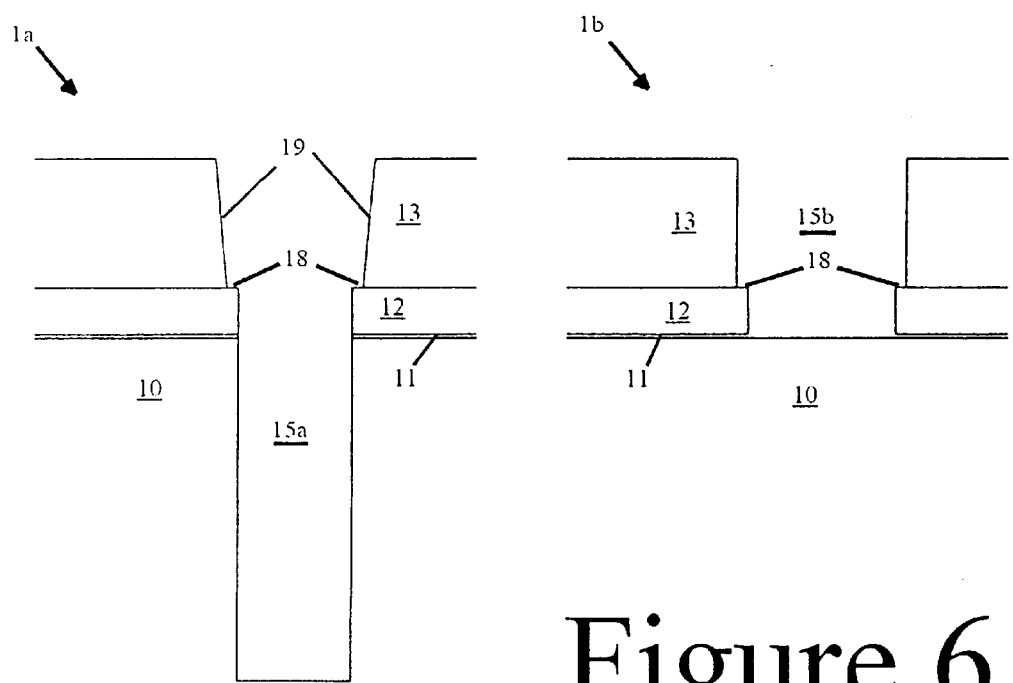
FIGS. 6 through 13 show the process steps of an embodiment of the invention for creating a conductive element within an array trench that is in electrical contact with the surrounding substrate.

Referring to FIG. 6, the second oxide mask 14 is stripped off. This may be accomplished with a vapor HF etch, preferably with heating. The stripping process will usually result in some erosion of the first oxide hard mask 14 depending upon the selectivity of the etch with respect to the second oxide 13, thereby resulting in some ledging 18 at the underlying pad nitride 12 and faceting 19 of the first hardmask.

Figure 7:
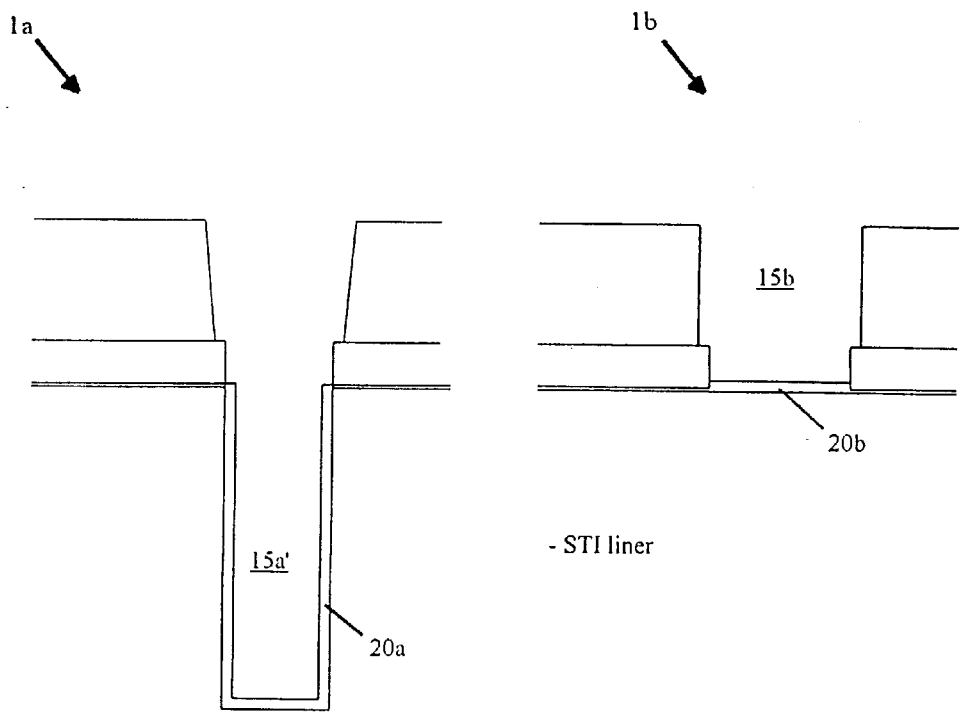

Referring to FIG. 7, a first array trench liner 20a is grown or otherwise deposited conformally inside the array trenches 15a' and a first support trench liner 20b is grown or otherwise deposited at the bottom of the support mask opening 15b. The first array trench-liners may be made to only deposit upon the silicon substrate 10 if the growth is obtained by heat oxidation of the silicon to form a silicon oxide liner.

At this point, the method of the invention may follow any one of four embodiments.

Figure 8:
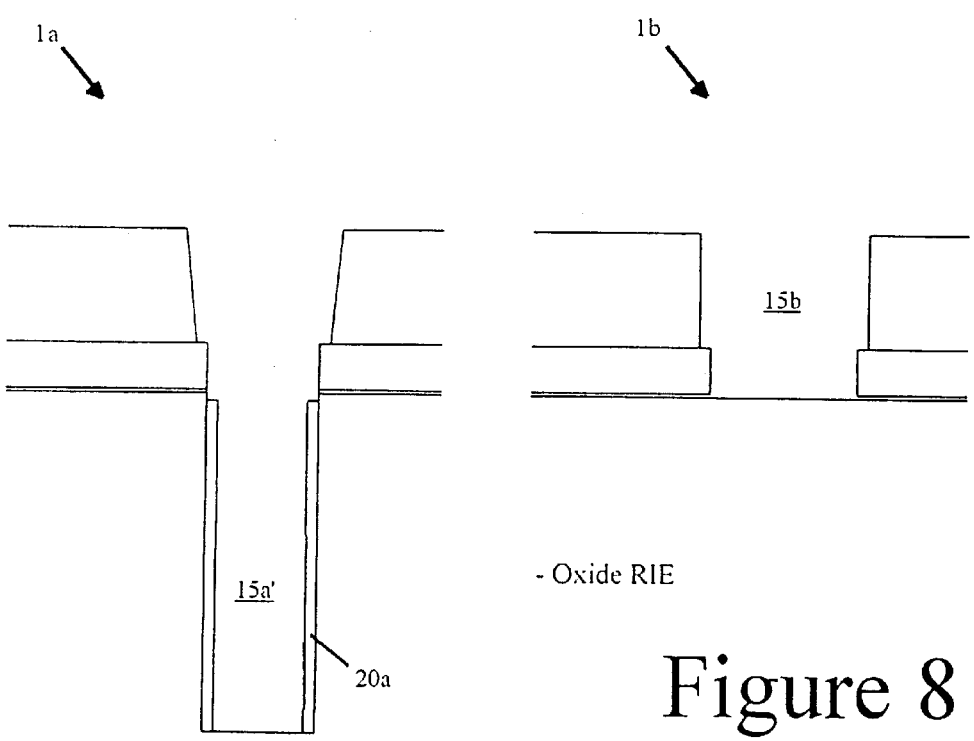

Referring to FIG. 8, there is described an embodiment of the invention that provides deep trenches with contact from the bottom. This is achieved by etching out the liner oxide 20a from the bottom of the array trench 15a', such as by a reactive ion etch (RIE). Of course, the liner oxide 20b at the bottom of the support mask opening 15b is also removed. By opening the bottom of the deep trenches 15a', conductive material deposited in the trench will be shorted to the substrate 10.

Figure 9:
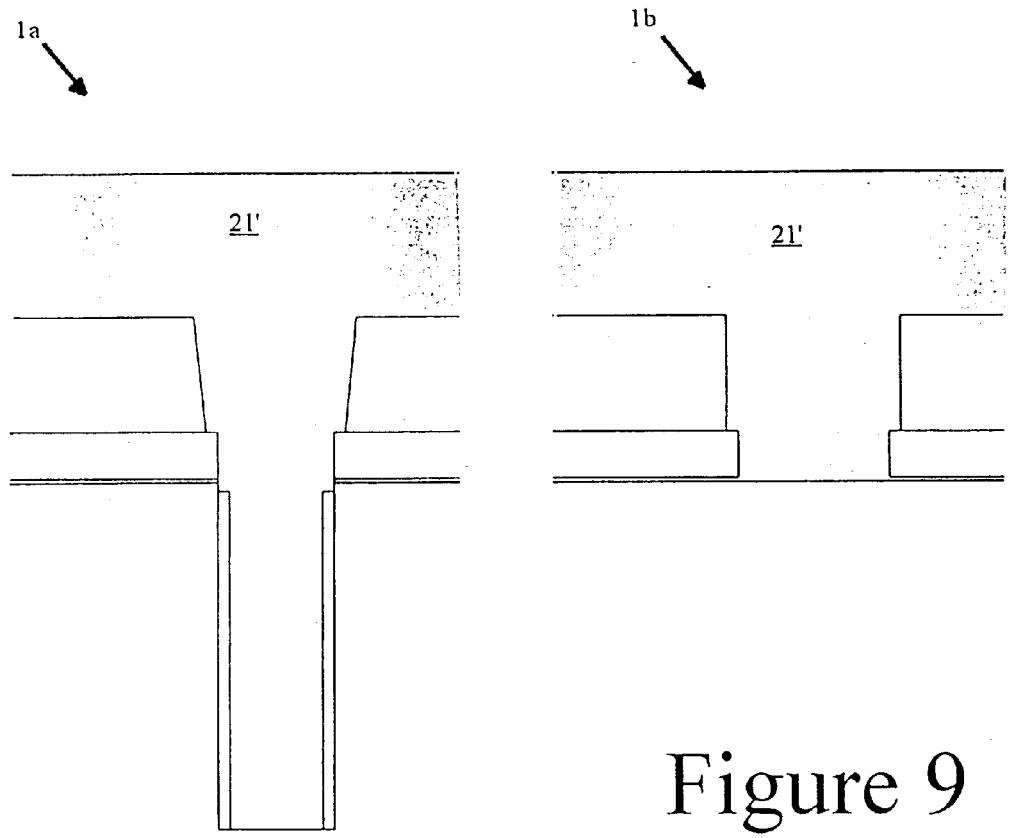

Referring to FIG. 9, a blanketing planarized conductive material layer 21' is laid down over the wafer 1, thereby filling the trenches and mask openings of both the support and array areas. Generally, this material will be silicon or polysilicon for the reasons set forth with respect to FIG. 10 below. Silicon or polysilicon films may be deposited by, for example, epitaxy or low-pressure chemical vapor deposition (LPCVD).

Commonly used precursors for epitaxial polysilicon growth comprise silicon tetrachloride ($SiCi_4$), trichiorosilane ($SiHCl_3$), dichlorosilane ($SiH_2Cl_2$), monosilane ($SiH_4$), and disilane ($Si_2H_6$) the later three being favored for producing thinner layers at lower deposition temperatures than silicon tetrachloride.

The precursors will generally be introduced into a reaction chamber with the semiconductor wafer accompanied by a large excess of hydrogen gas, which acts both as a reducing agent and as a diluent for the precursor. The rate of epitaxial growth will vary positively with temperature, pressure, and reactant concentration, though in general diminished increases in reaction rate with temperature begins to become evident at temperatures around and above about 1,000 C. Reaction conditions being equal, the rate of growth will depend upon the precursor used in the order from fastest to slowest of $Si_2H_6 > SiH_4 > SiH_2Cl_2 > SiHCl_3 > SiCl_4$.

Before the epitaxy, however, it is often desirable to prepare the surface upon which the polysilicon will be grown. Such cleaning procedures may include a so-called "wet clean" comprising a sulfuric acid and peroxide bath, followed by a water rinse, followed by an ammonium hydroxide bath, followed by another water rinse, followed by a HF dip, followed by a quick water rinse, followed by a hydrochloric acid and peroxide bath, followed by a, water rinse, and then dried in an inert atmosphere to avoid reoxidation of the silicon surfaces. The wet clean may be followed by yet another HF dip, which will delay further oxidation for up to one-half hour. Alternatively, an HCl etch at high temperature in the presence of hydrogen gas may be used.

Another method of preparing the wafer for epitaxy is to bake the wafer to about 850 C. to 900 C. in a hydrogen atmosphere.

Low pressure chemical vapor deposition LPCVD of polysilicon is generally carried out at temperatures between 550 C. to 700 C., usually at about 625 C., and at pressures between 0.25 to 2.0 torr, preferably in a hot-wall or vertical furnace, or in a single-wafer polysilicon reactor. The polysilicon may be deposited by the pyrolysis of Silane ($SiH_4$) resulting in the release of hydrogen gas. The reaction may be carried out in an atmosphere of pure silane gas, or the silane may be diluted with an inert carrier gas, such as nitrogen or argon. Alternatively, the silane may be diluted in hydrogen gas. Typically, diluted reaction gases will utilize about 25% silane.

It is also preferable to use distributed feed reactors so as to avoid the necessity of ramping reaction temperature, as is utilized in conventional LPCVD tube reactor systems to overcome the depletion of reactants along the length of the tube. Uniformity of reaction temperature is desirable because the reaction rate of LPCVD polysilicon deposition is exponentially dependent upon temperature at temperatures below 750 C.

The structure of polysilicon deposited using LPCVD techniques will generally depend on reaction temperature. Films deposited at temperatures below about 580 C. will generally be amorphous, while those above that temperature will be polycrystalline Referring to FIG. 10, the conductive material fill 21' is etched down until all conductive material fill 21' material is removed from the support mask openings and the etch penetrates into the substrate 10 to a desired depth, thereby providing array trench isolations 15a'. The result is that the array and support trenches 15a', 15b' are now at identical depth, with a conductive element 21 installed in the bottom of the deep trenches. This is desirable because identical depths will make later planarization steps easier by yielding a favorable topography from later deposition steps. To ensure equal depths is achieved, the conductive material fill 21' and the substrate 10 will be chosen to be of materials that etch at substantially the same rate under identical etching conditions. The most straightforward means of achieving this is to use the same material for both, but it is sufficient that one be silicon and the other polysilicon, because these two forms of silicon etch at nearly identical rates. The etch may be a reactive ion etch, for example, or a suitable plasma etch, such as in a methyl trifluoride ($CHF_3$) environment. The etch will preferably start off anisotropically and finish isotropically so as to avoid damaging any silicon substrate that might be exposed just above the oxide liner 20a Referring to FIG. 11, the first oxide hardmask 13 is removed, causing the exposed portions of the liner oxide 20a to be stripped away. Removal of the oxide may be accomplished with a wet hydrofluoric acid (HF) bath or dry plasma HF etch.

Referring to FIG. 12, the trenches are again oxidized to reconstitute the array trench liner oxide 20a and install a support liner oxide 20b.

Figure 13:
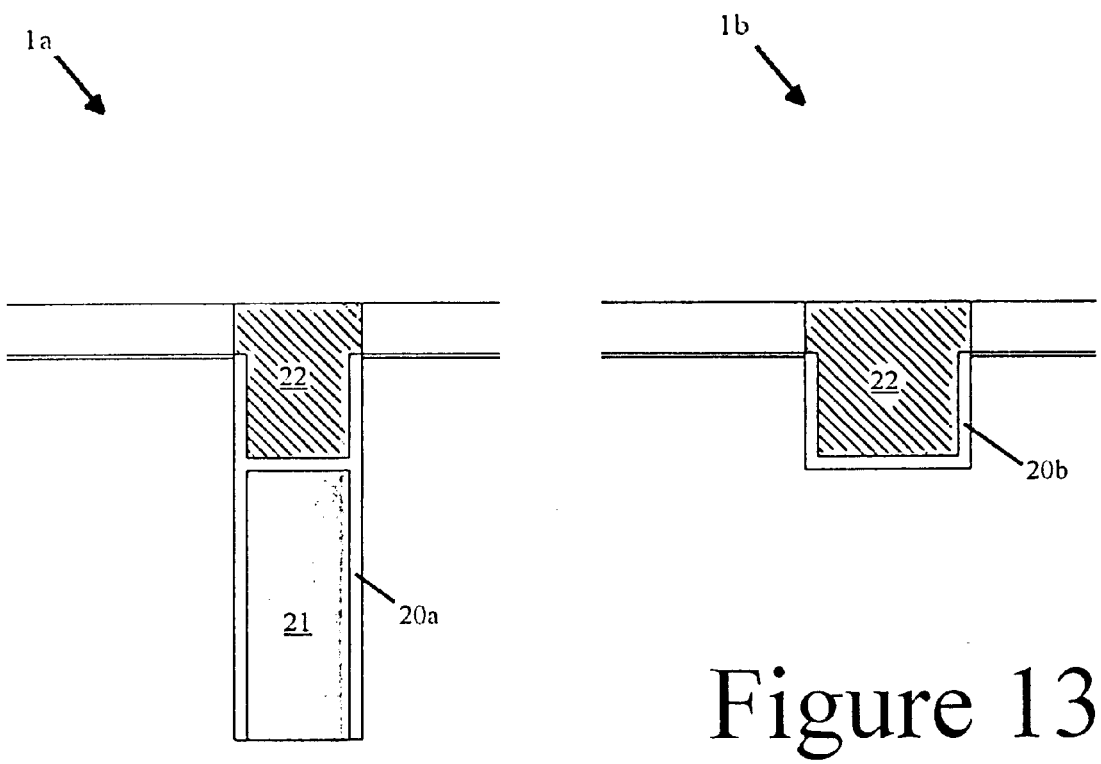

Referring to FIG. 13, in the final step of this embodiment, the trenches are filled with a planarized layer of silicon oxide 22, such as by HDP deposition. As can be seen, the oxide layers 22 of both the array and support trenches are of identical depth, and the array trench is now installed with a conductive element 21 in electrical contact with the substrate 10 that may be used as a field shield for vertical devices.

HDP-CVD silicon oxide films may generally be formed by reacting silane gas ($SiH_4$) with oxygen ($O_2$) gas in the presence of electromagnetic radiation and an inert gas, such as Argon (Ar) or Helium (He), for example. The film may then be planarized by chemical-mechanical polishing (CMP).

Generally, the reaction pressure will be rather low, generally below ten mTorr, and will usually be conducted in a magnetron sputtering environment. Under these conditions, the film being deposited begins to cover all the surfaces on the wafer conformally, including the sidewalls and bottoms of contact holes and trenches. Under normal CVD processes, this would cause an overhang at the rims of the trenches and holes that would eventually close off at the top, thereby leaving a cavity within. However, in HDP deposition the excitation of the inert gases and reactants into a high-energy plasma causes the deposited material to be continuously sputtered away even as it is being deposited. The result is that the deposited material behaves like a fluid and settles into the trenches and holes in a planarized, rather than conformal, manner and thereby avoiding the formation of any cavities.

HDP-CVD reactors will generally utilize a glow discharge to produce ions powerful enough to cause sputtering in the material being deposited. Glow discharges are a self-sustaining plasma produced by either or both of a dc-diode type system or an rf-diode system. An inert gas, such as Argon is introduced between a pair of electrodes with a strong enough electric field to ionize the reactant and inert gases to a plasma. Rf-diode systems are preferred because they can operate at significantly lower pressures and deliver higher deposition rates than dc-diode systems. A preferred rf-diode system will be equipped with a magnetron source so as to help confine electrons near the wafer surface.

In a second embodiment, the conductive component is insulated from the surrounding substrate and may be contacted from the top.

Figure 14:
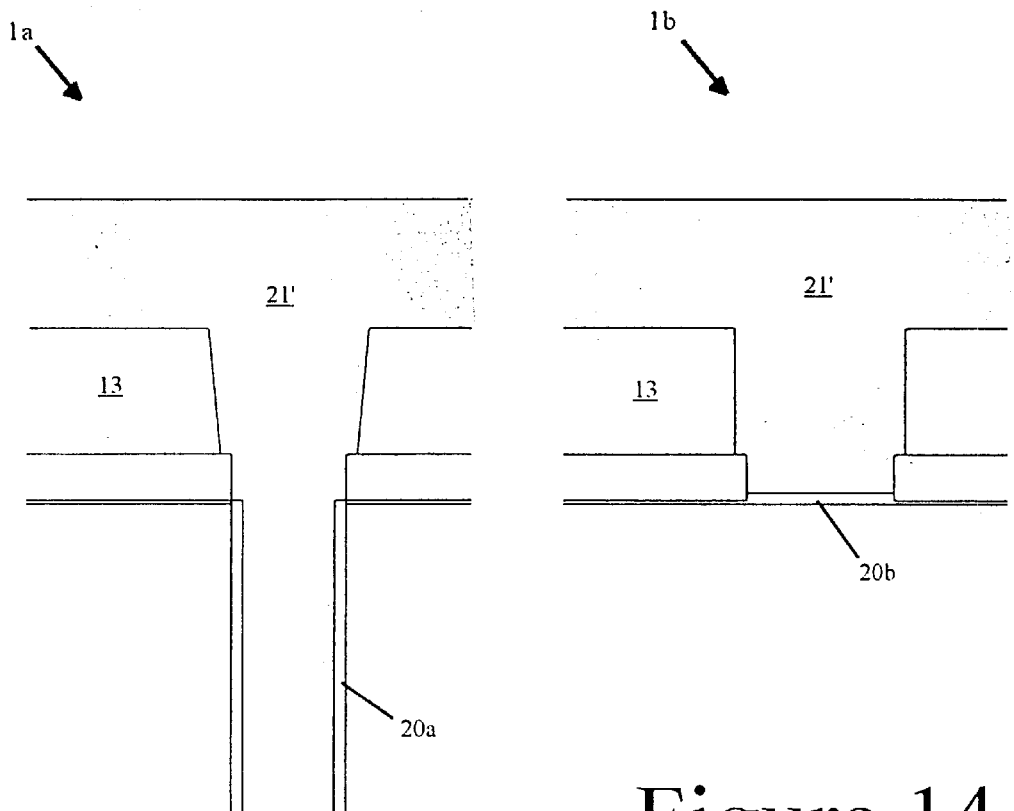
FIGS. 14 through 21 show the process steps of an embodiment of the invention for creating a conductive element within an array trench that is electrically isolated from the surrounding substrate.

Referring to FIG. 14, the structure of FIG. 7 is covered with a blanketing planarized layer of conductive material 21', preferably polysilicon, that fills in all the mask openings and trenches of both the support and array areas.

Figure 15:
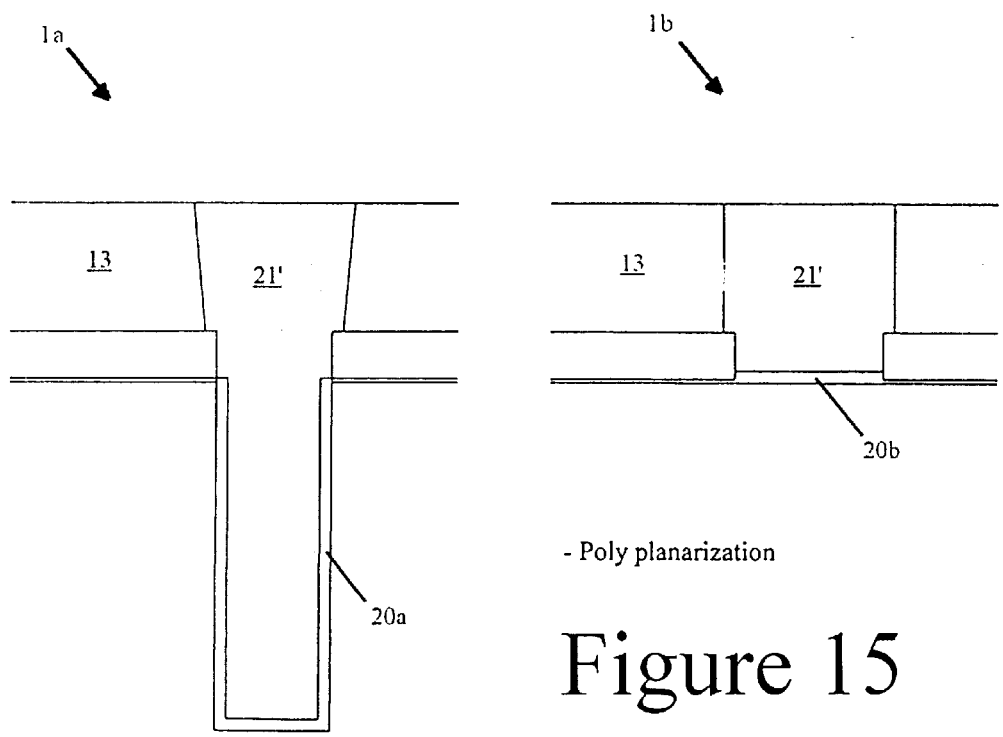

Referring to FIG. 15, the conductive material fill 21' may optionally planarized down to the level of the first hardmask 13 so as to give a superior starting surface for the following etching steps. Note that this step could have also been optionally utilized after the fill described with respect to FIG. 9 prior to the etching operation described with respect to FIG. 10.

Figure 16:
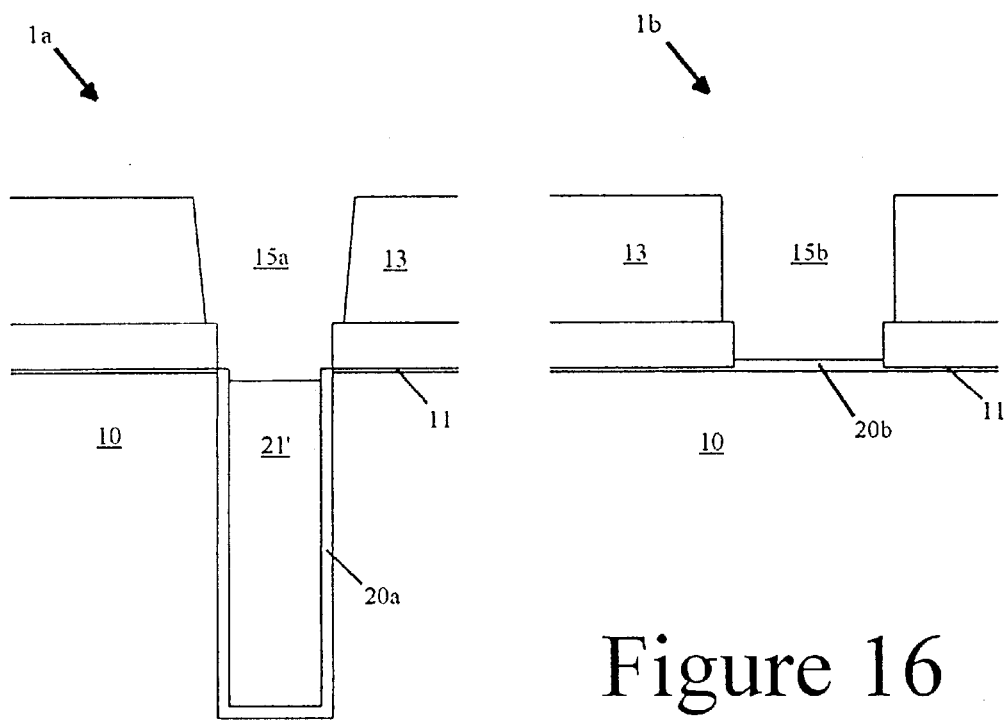

Referring to FIG. 16, the conductive material fill 21' is then etched down until all conductive material has been removed from the support mask openings 15b.

Figure 17:
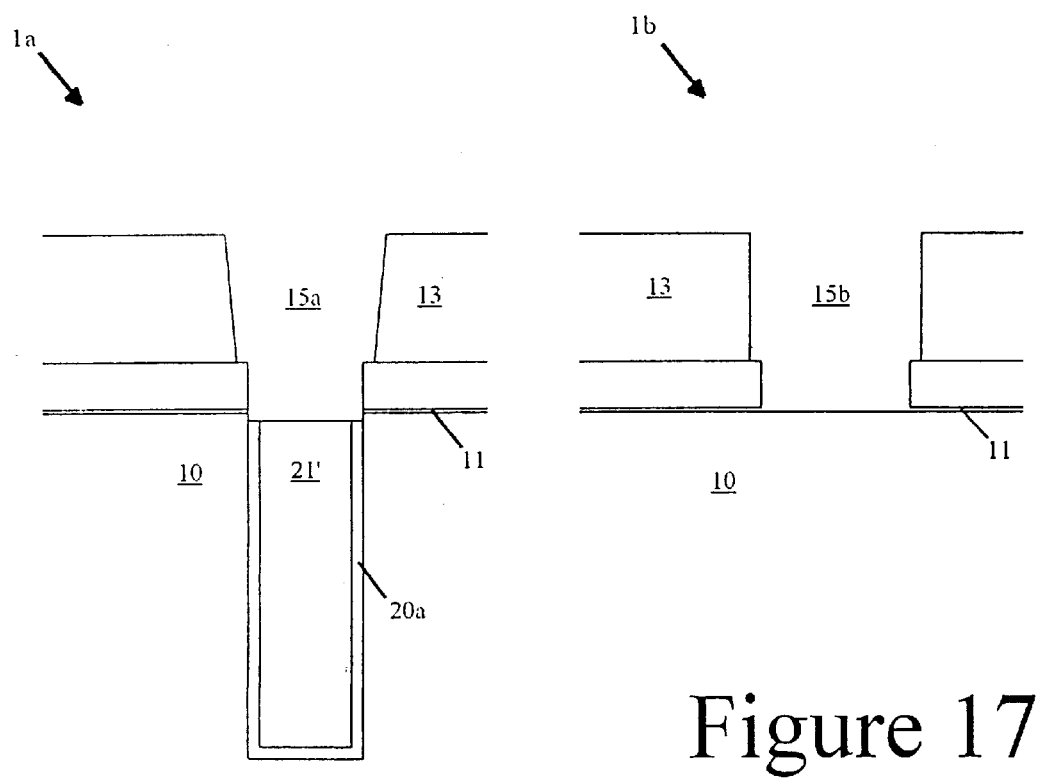

Referring to FIG. 17, the support liners 20b are etched away with an oxide RIE. The array liners 20a are largely protected by the conductive material fill 21' and will be only slightly recessed.

Figure 18:
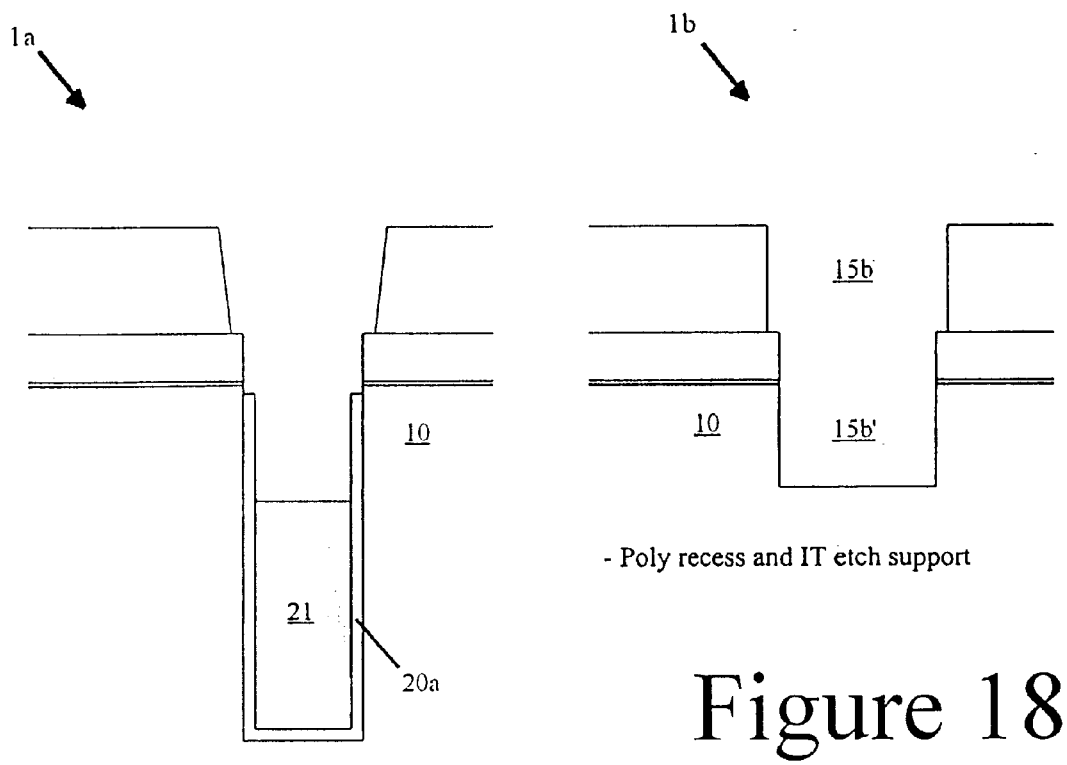

Referring to FIG. 18, the conductive material fill 21' is etched down to a desired depth. The etch simultaneously etches the polysilicon substrate 10 through the support mask openings 15b so as to create support isolation trenches 15b', such that both the array 15a' and support trenches 15b' are of equal depth. This leaves a portion of the conductive material in the bottom of the array trench to serve as a conductive element 21 that is electrically insulated from the surrounding substrate 10 by the oxide liner 20a. This etch will again typically be an RIE.

Figure 11:
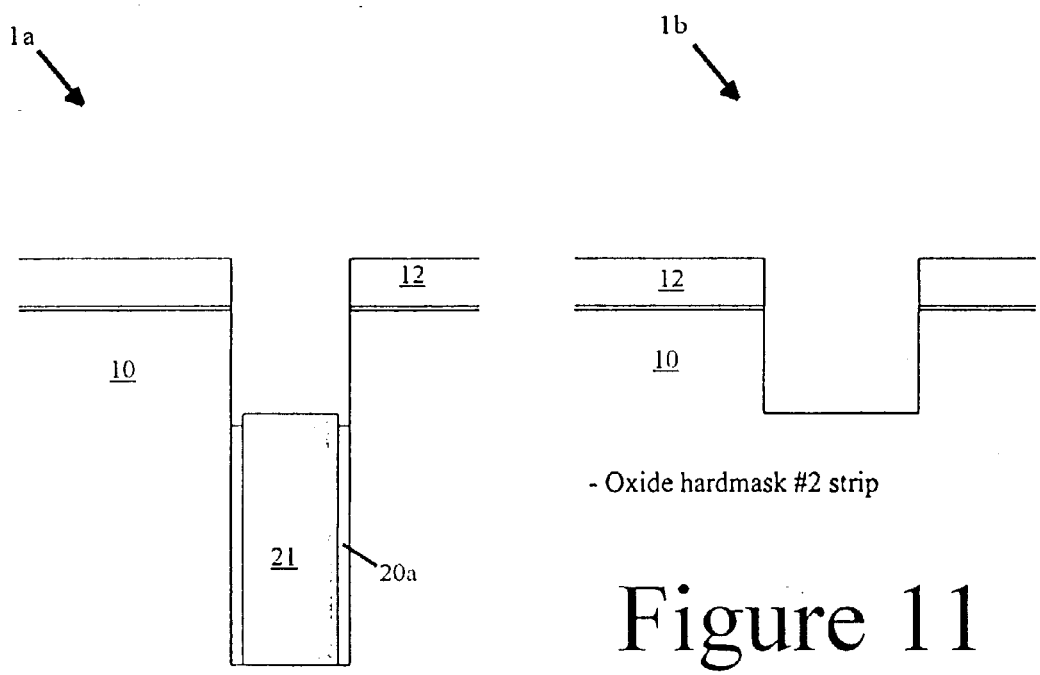
Figure 12:
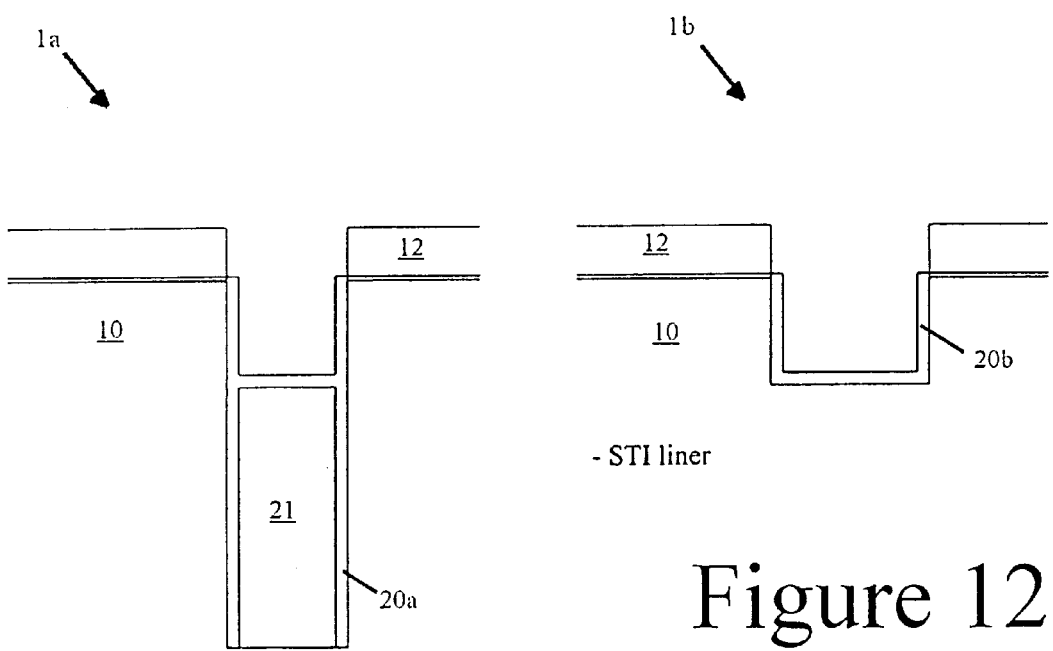
Figure 19:
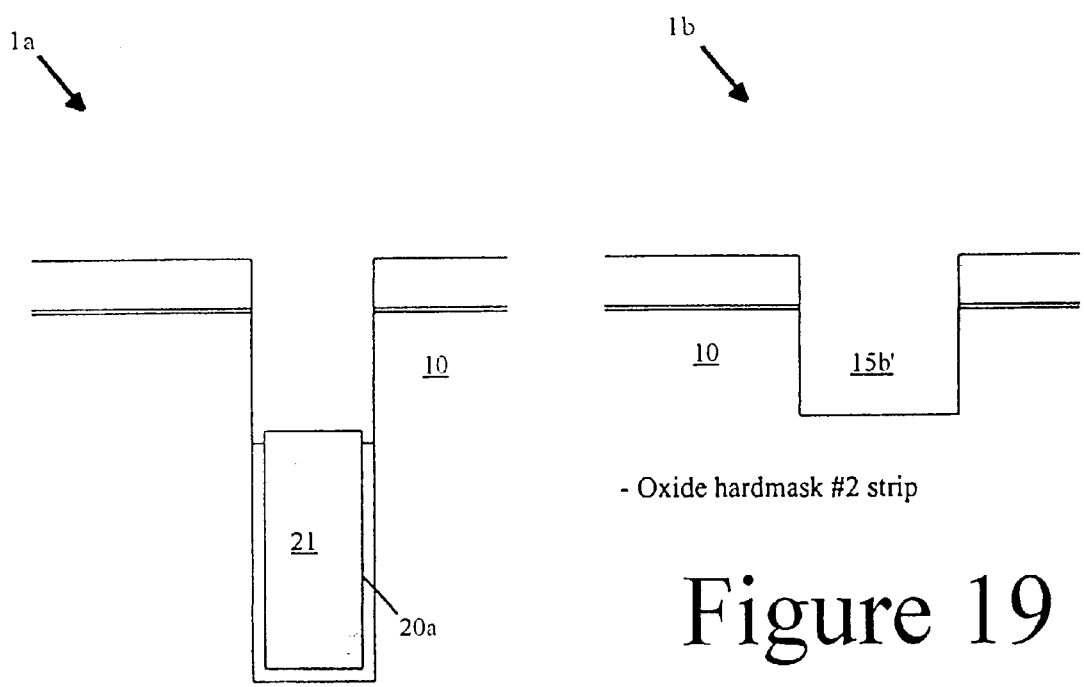
Figure 20:
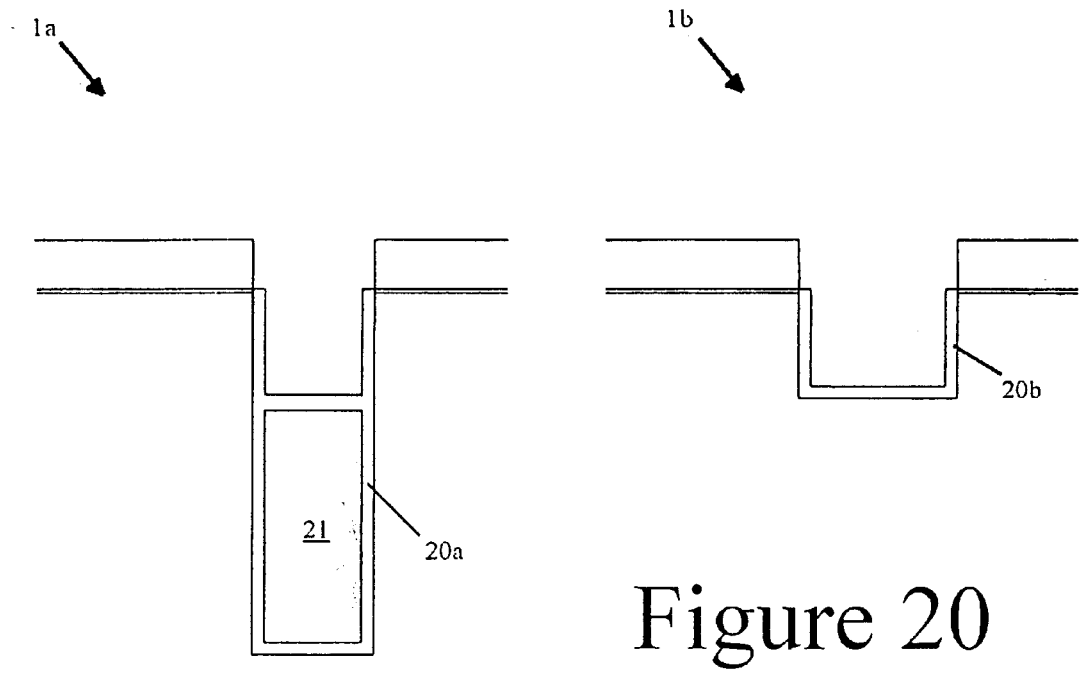
Figure 21:
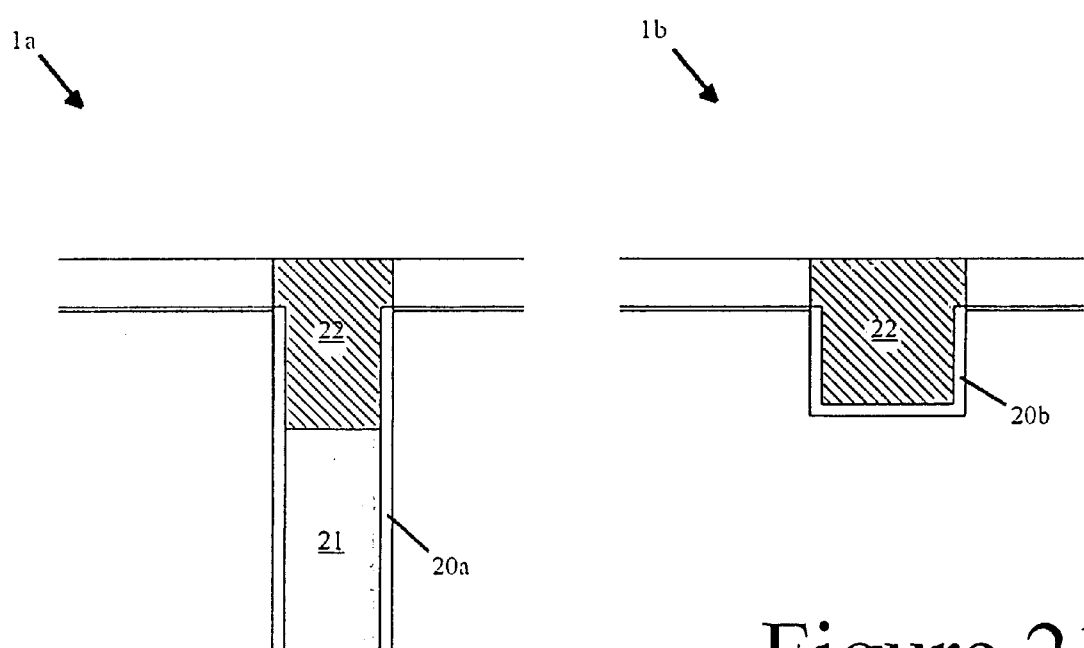

Referring to FIGS. 19 through 21, the hardmask 13 is removed, such as by a HF etch, and the trenches are again relined with oxide in the same manner as that described with respect to FIGS. 11 through 13, thereby resulting in the structure shown in FIG. 21.

Figure 22:
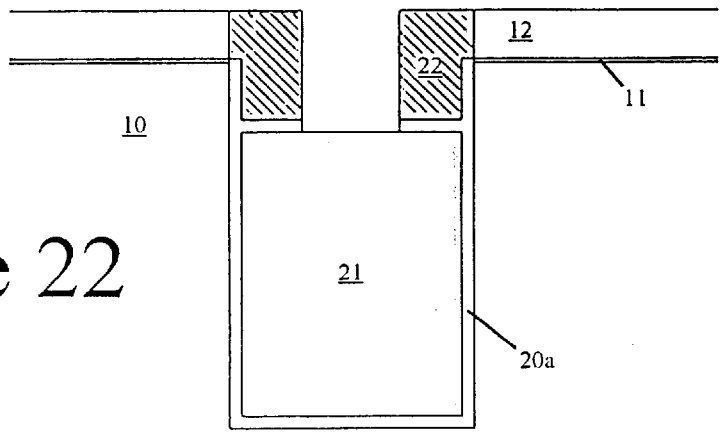
FIGS. 22 through 24 show process steps for forming an electrical contact with a conductive element that is electrically isolated from the surrounding substrate.

Referring to FIG. 22 there is shown a method by which the conductive element 21 within the trenches may be electrically accessed. First, the planarized oxide fill 22 is etched through a mask down through the array liner material 20a all the way to the conductive element 21.

An RIE etch of silicon oxide will generally utilize a $CF_4$—$O_2$ or $CF_4$—$H_2$ gas mix in the presence of an rf-frequency to establish a glow discharge. The reaction rates may be rendered selective with respect to polysilicon by utilizing oxygen in excess of 20% by volume, preferably at least 40% by volume, in the gas stream for $CF_4$—$O_2$ gas mixes. $CF_4$—$H_2$ streams are always selective for silicon oxides with respect to polysilicon, but will preferably contain at least 10% hydrogen gas, more preferably at least about 40% hydrogen, still more preferably at least about 50% hydrogen gas. Typical reaction pressures may range from about 7 to about 6000 mTorr, but will generally center about 25 mTorr.

Figure 23:
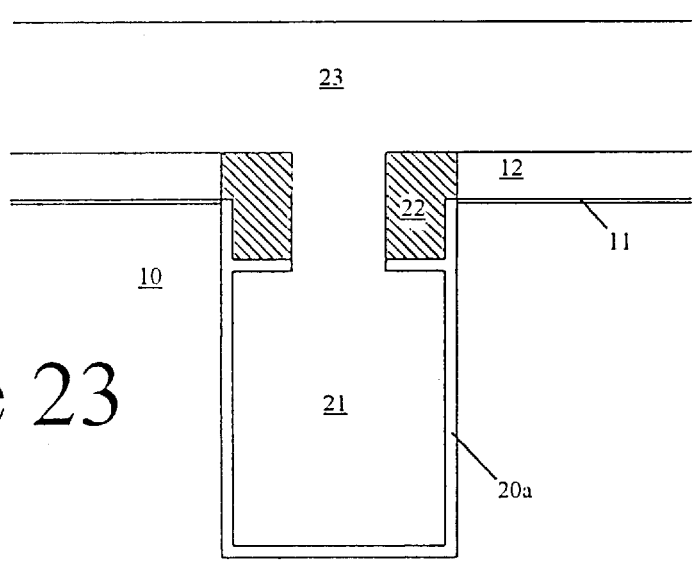

Referring to FIG. 23, a conductive layer 23, such as of polysilicon, is laid down so as to make electrical contact with the conductive element 21.

Figure 24:
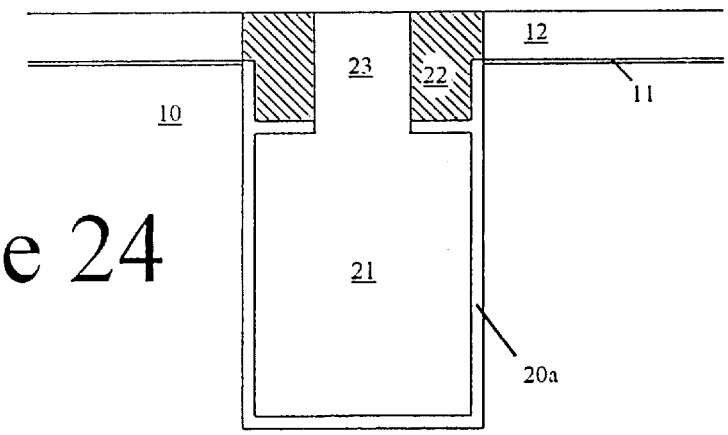

Referring to FIG. 24 the conductive layer 23 may be planarized down to the pad nitride 12. As can be seen, there now exists an accessible conductive element 21 separated from the substrate 10 by a dielectric 20a. The conductive element 21 may now serve as a field shield for adjacent vertical devices by biasing it as desired. Planarization will typically be accomplished with chemical-mechanical polishing (CMP).

Figure 25:
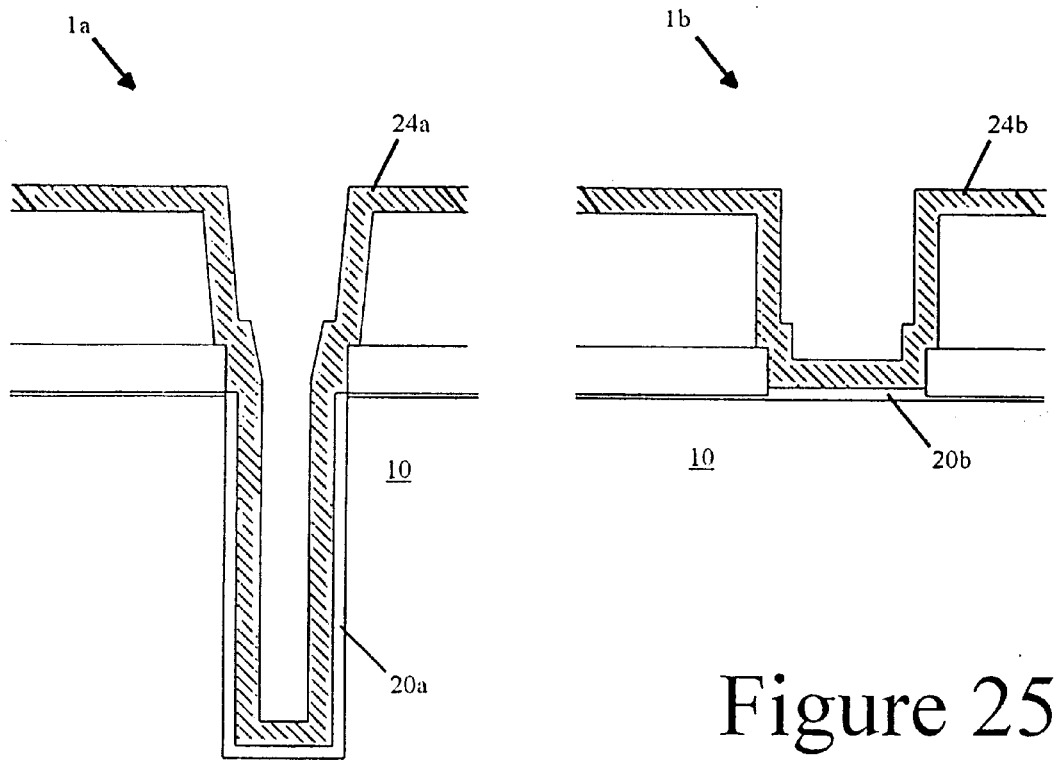
FIGS. 25 through 27 show process steps for another set of embodiments wherein a conductive element, whether in electrical contact with or electrically isolated from, the surrounding substrate is surrounded by a heavier dielectric so as to reduce parasitic capacitance.
Figure 27:
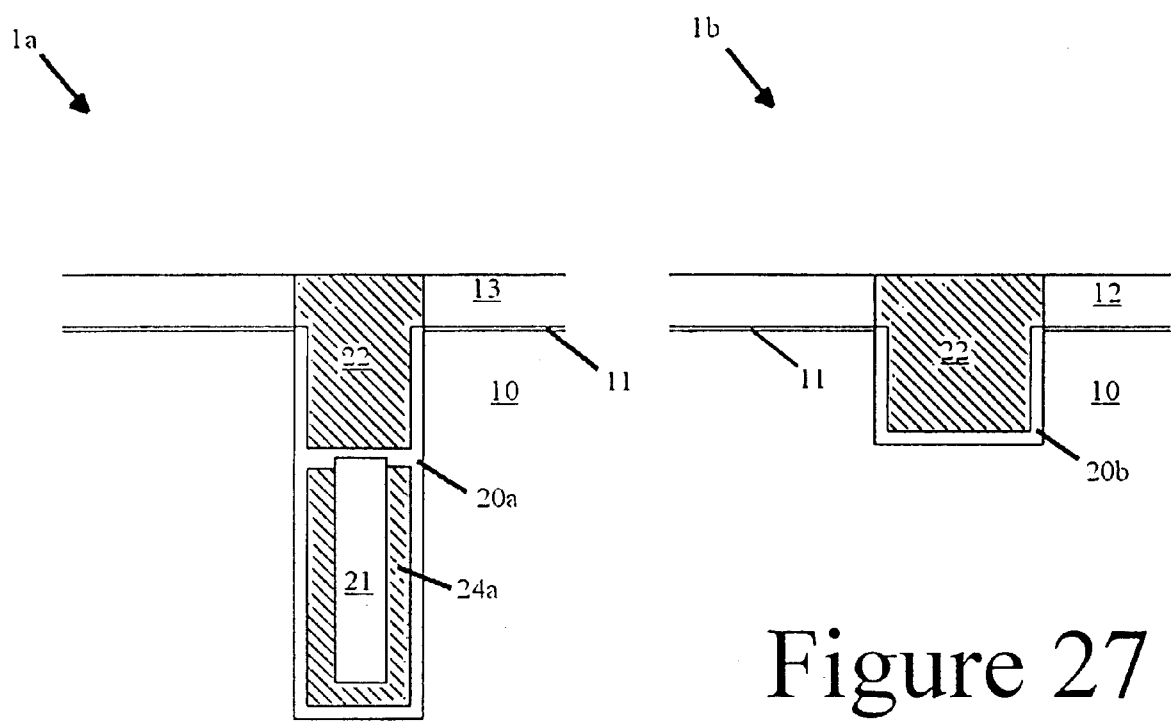

Referring to FIGS. 25 and 27, there is shown a third embodiment of the invention, wherein the structure of FIG. 7 is completely covered with a silicon oxide deposition so as to form second array oxide liners 24a and second support oxide liners 24b. From this point, the process continues as with respect to FIGS. 14 through 21, except that the final product will have a heavier dielectric surrounding the conductive element 21, thereby reducing parasitic capacitance, as shown in FIG. 27.

Figure 26:
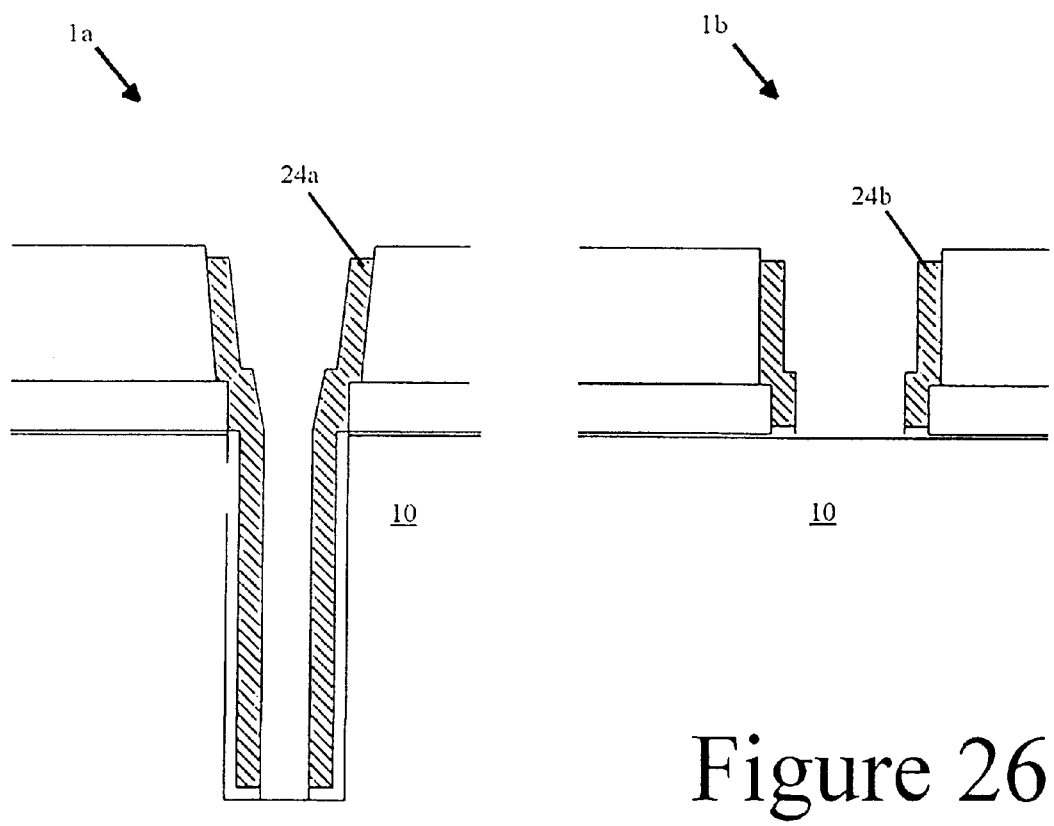

Referring to FIGS. 26 and 27, in a fourth embodiment of the invention, the bottom of the second oxide liners may be etched out with an oxide RIE and then the process steps as described with respect to FIGS. 9 through 13 carried out thereby shorting the conductive element 21 to the substrate 10. The result is analogous to that of FIG. 27, excepting that the conductive element 21 is in electrical contact with the substrate 10.

In another set of embodiments of the invention, a silicon oxide fill is positioned beneath the conductive element so as to be able to control the vertical positioning thereof.

Referring to FIG. 28, there is shown again in cross section an array substrate area 1a comprising memory cells and a support area 1b comprising supporting circuitry on a semiconductor substrate 1 of a semiconductor memory, such as a PROM, DRAM, EPROM, EDRAM, and the like. The figures show a typical starting structure. Typically, the chip is prepared by growing a pad oxide 11 layer upon a silicon substrate 10. On top of the pad oxide layer 11 there is deposited a pad nitride 12, and a first oxide hard mask 13. Note that this structure differs from that of FIG. 1 in that there is provided no second hard mask.

Referring to FIG. 29, the array trenches 15a' and support trenches 15b' are etched down into the substrate as defined by the mask openings 15a, 15b.

Figure 30:
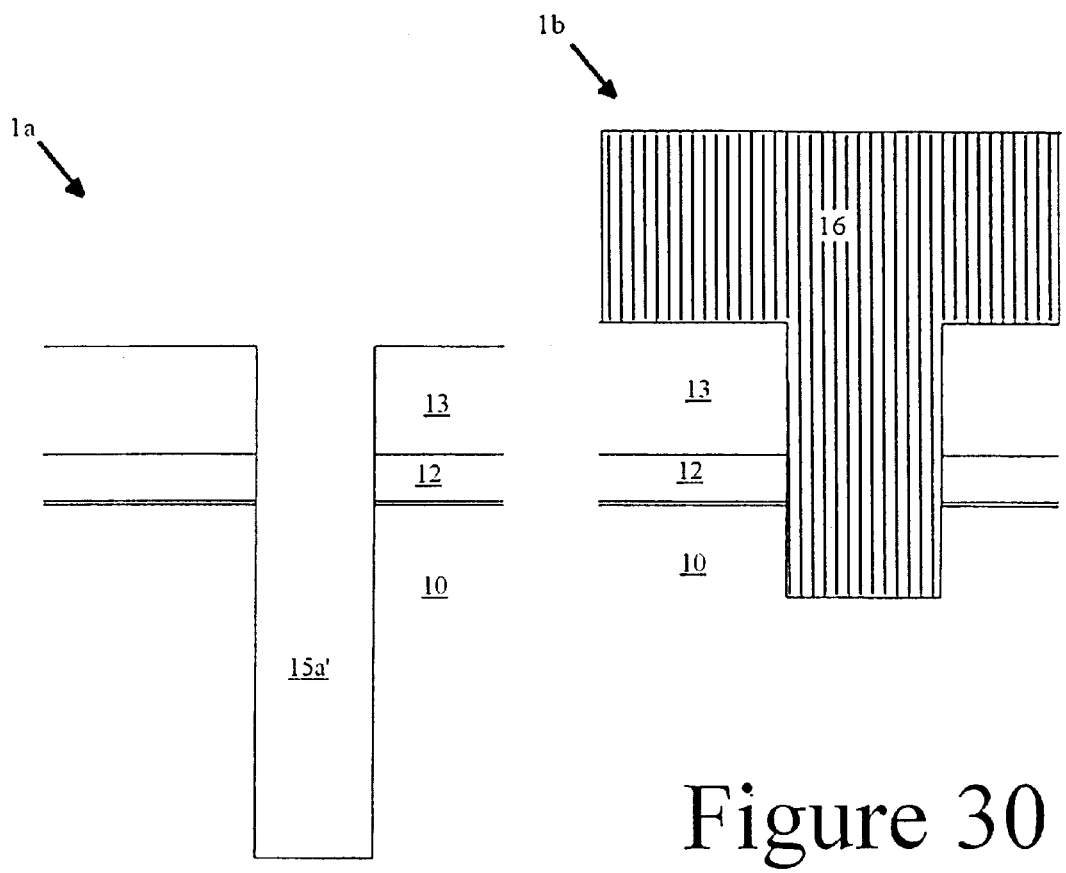

Referring to FIG. 30, the support trenches are protected with a photoresist mask 16 and the array trenches 15a' etched further down into the substrate 10. This is the last operation that differs between the array and support trenches until a contact is provided in accordance with the method described with reference to FIGS. 22 through 24.

Figure 31:
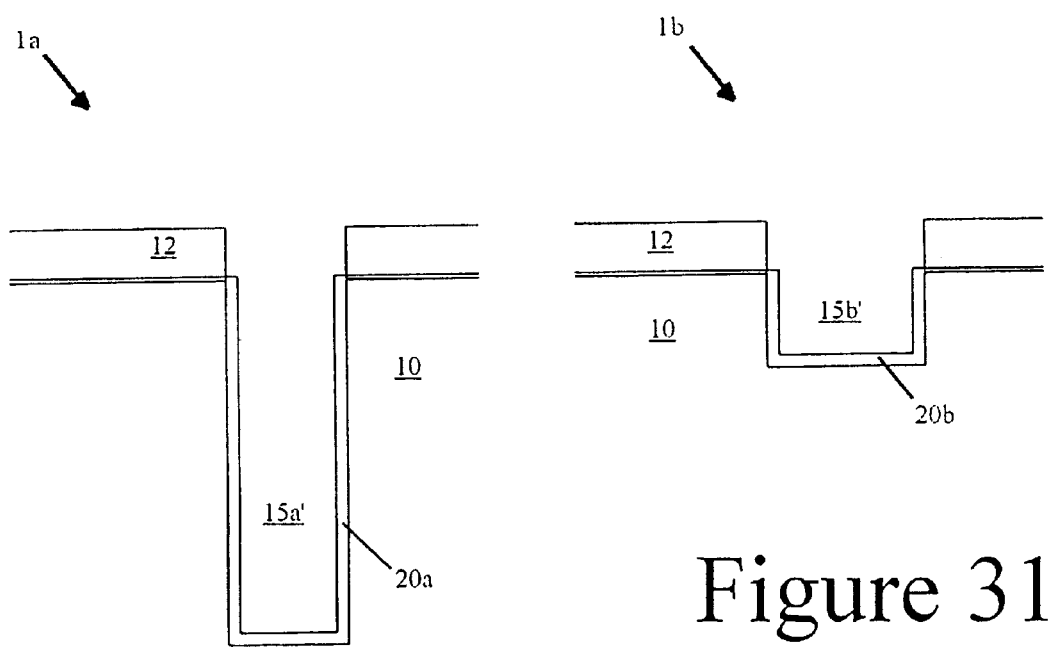
FIGS. 31 through 36 show preparatory steps for the second set of embodiments of the invention wherein the processing of array areas is identical to and executed simultaneously with that of support areas.

Referring to FIG. 31, the photoresist mask 16 and mask oxide 13 are stripped and the trenches 15a', 15b' provided with oxide liners 20a, 20b.

Figure 32:
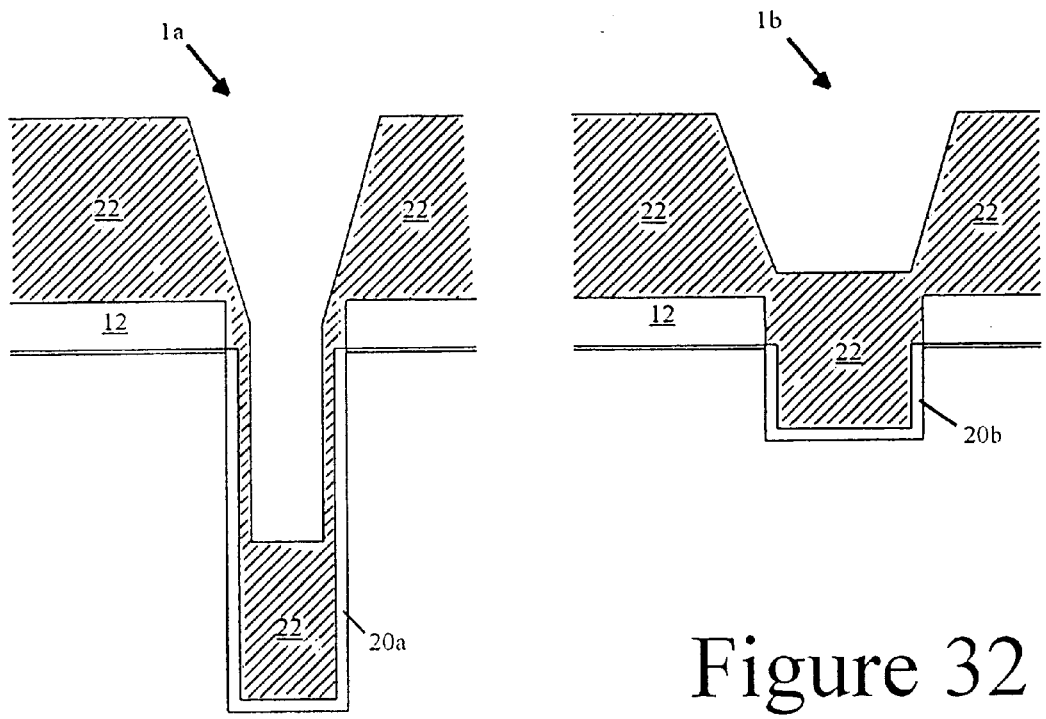

Referring to FIG. 32, an oxide fill 22 is deposited. This may be accomplished with a high-density plasma CVD (HDP-CVD) process.

Figure 33:
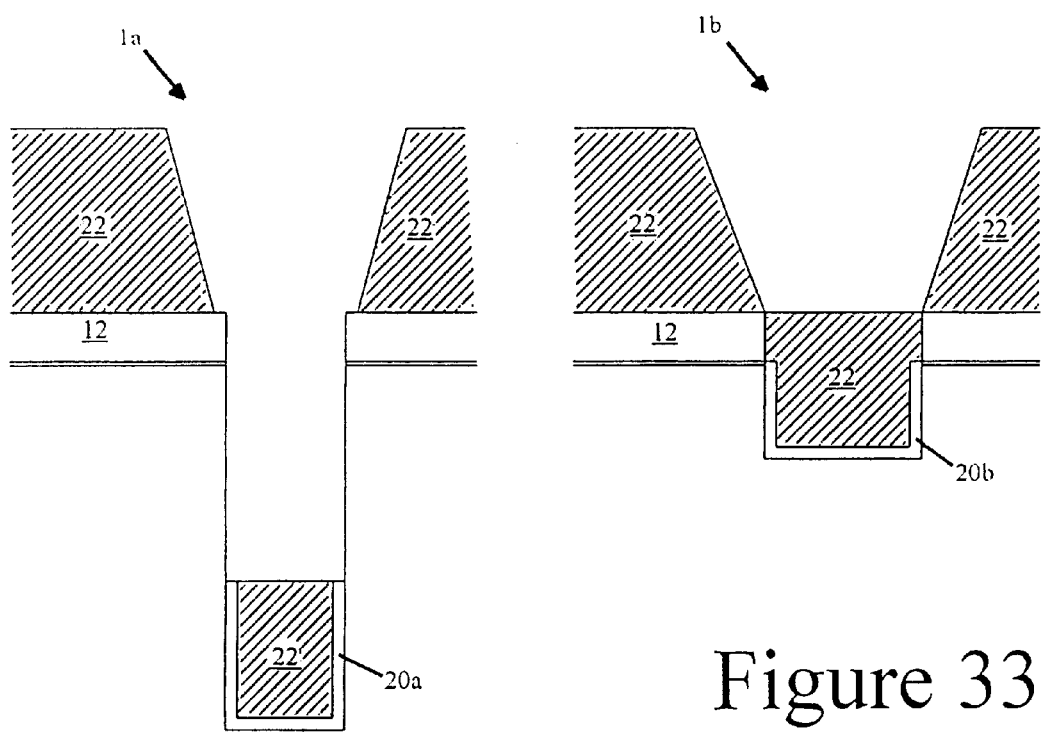

Referring to FIG. 33, the oxide fill 22 is etched back enough to planarize the support trenches 15b to the level of the pad nitride layer 12 and to strip the inner walls of the array trenches 15a of oxide, while leaving an oxide plug 22' at the bottom thereof. This may be accomplished with a wet etch.

Figure 34:
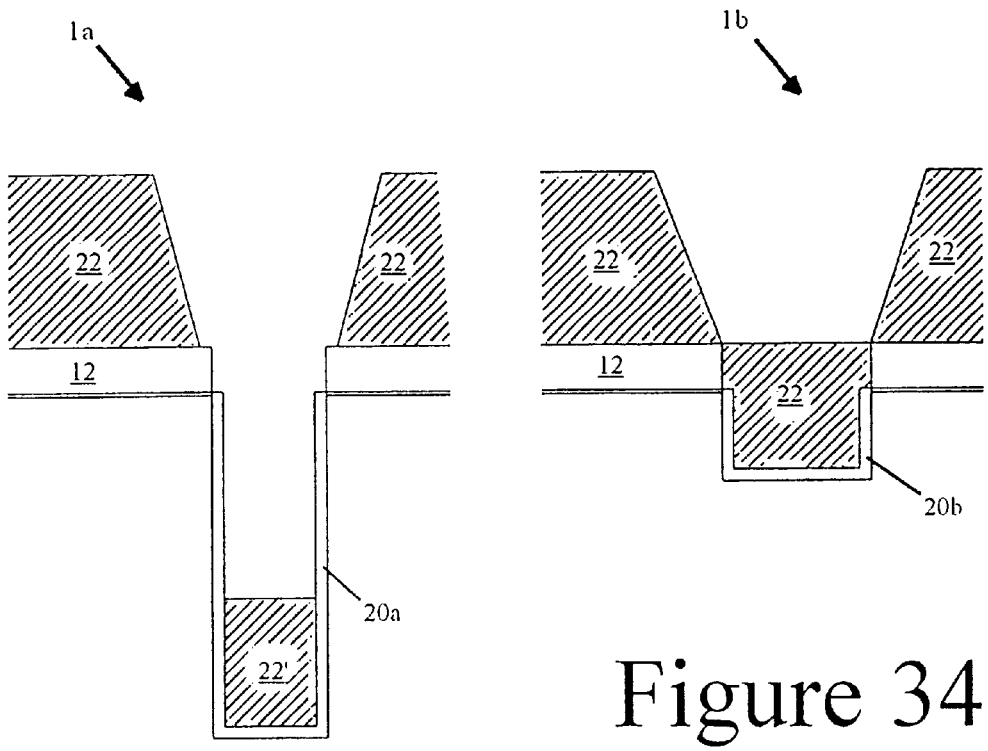
Figure 35:
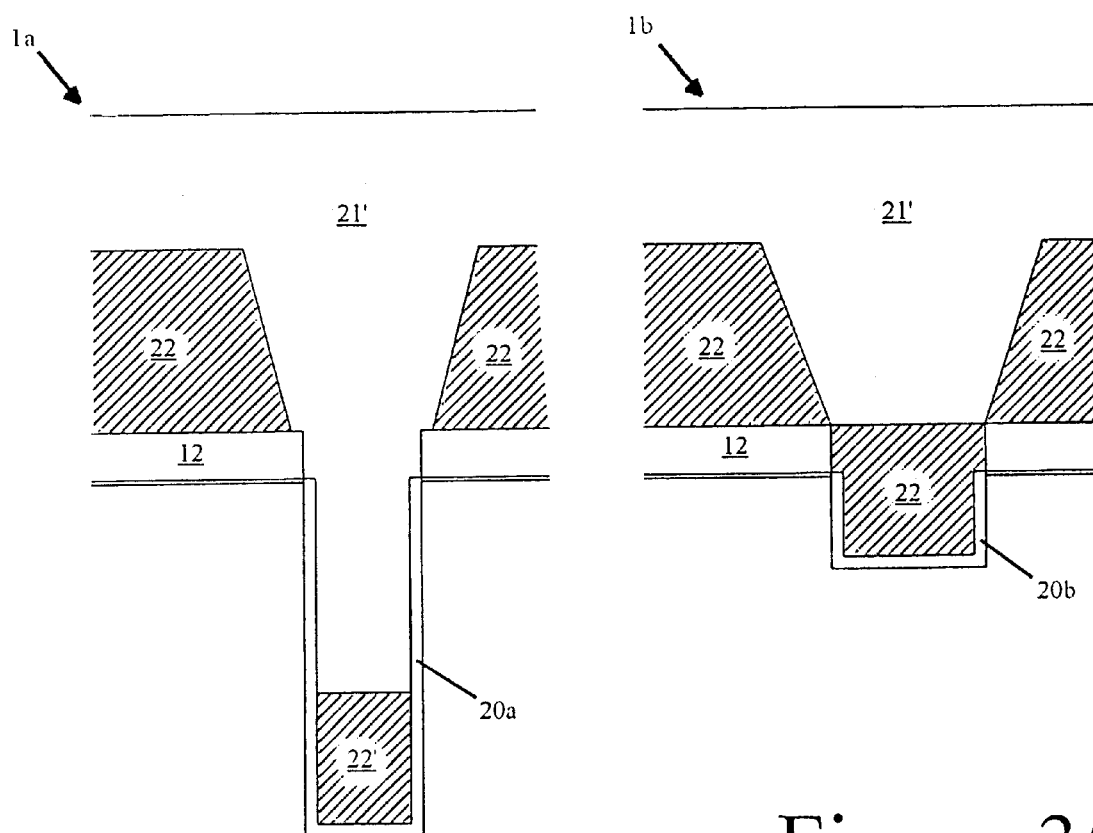
Figure 36:
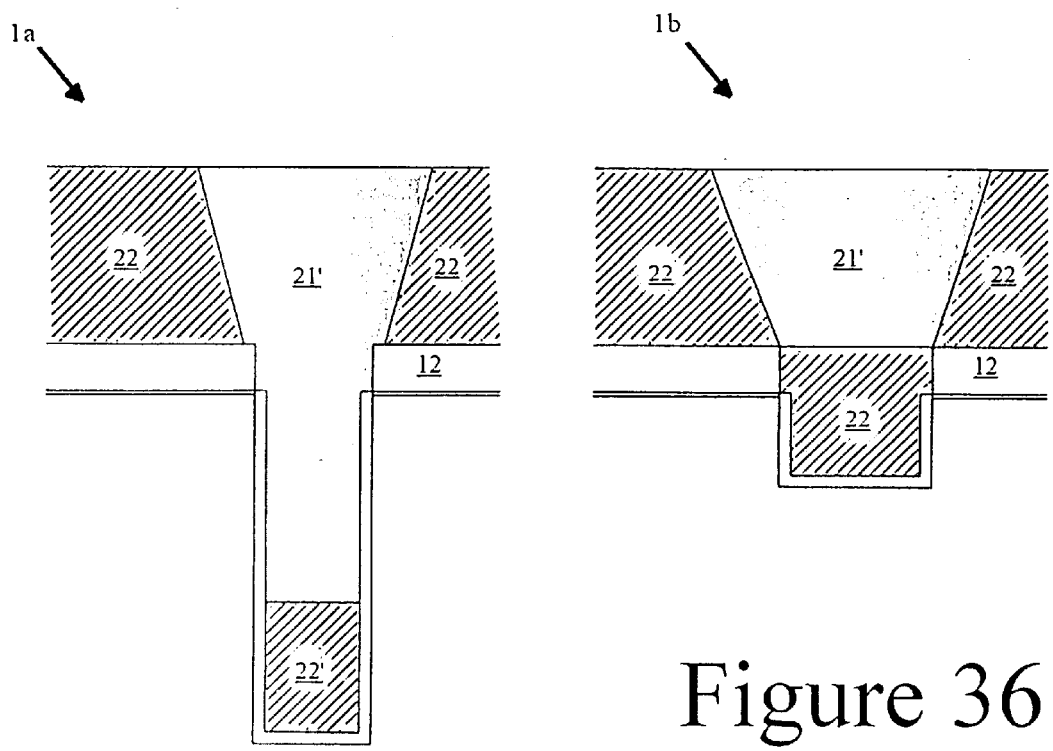

Referring to FIGS. 34 to 36 the array trenches 15a' are relined with oxide 20a and the entire wafer deposited with a blanketing layer of conductive material 21', which is then planarized down to the level of the oxide fill 22.

Starting from the structure shown in FIG. 36, there are two methods that may be used to obtain the desired final structure.

Figure 37:
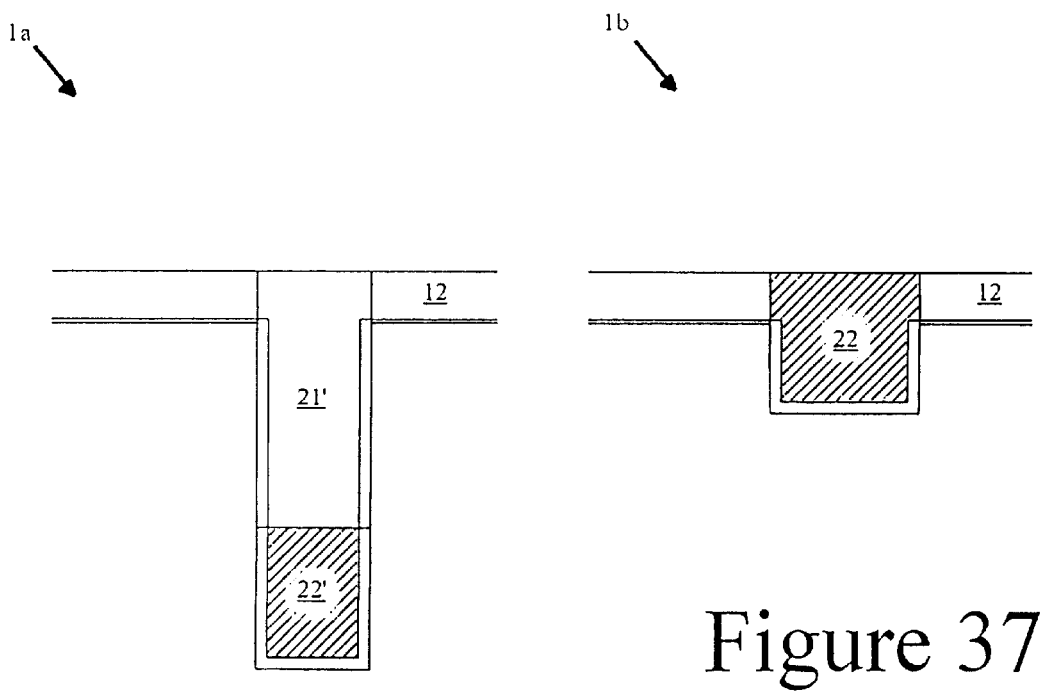
FIGS. 37 through 38 show a first embodiment of the second set of embodiments of the invention for obtaining a target structure as depicted in FIG. 39.
Figure 38:
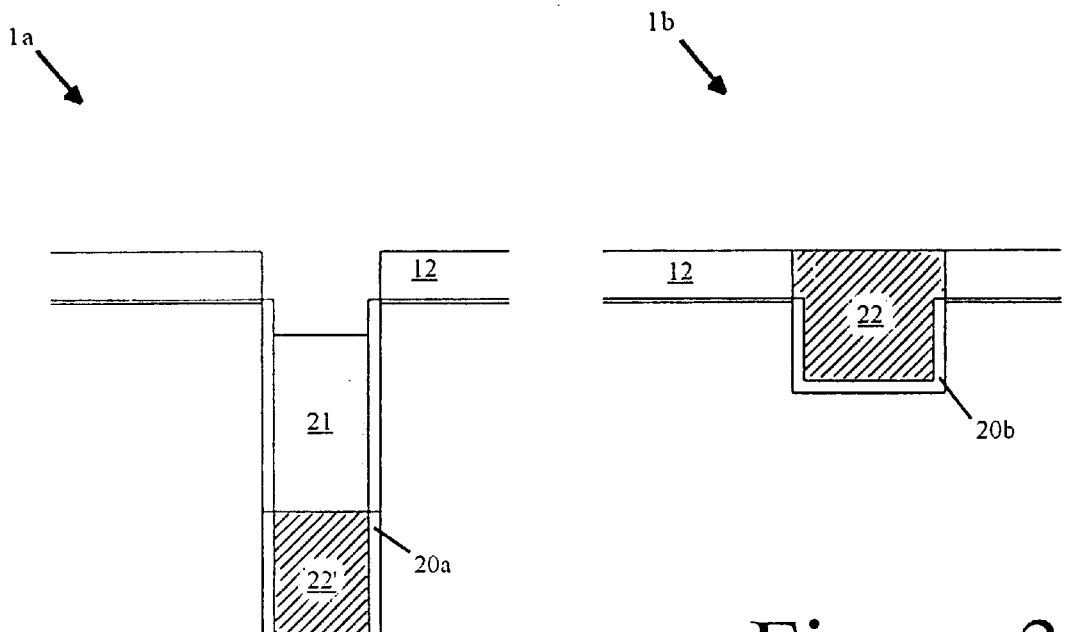
Figure 39:
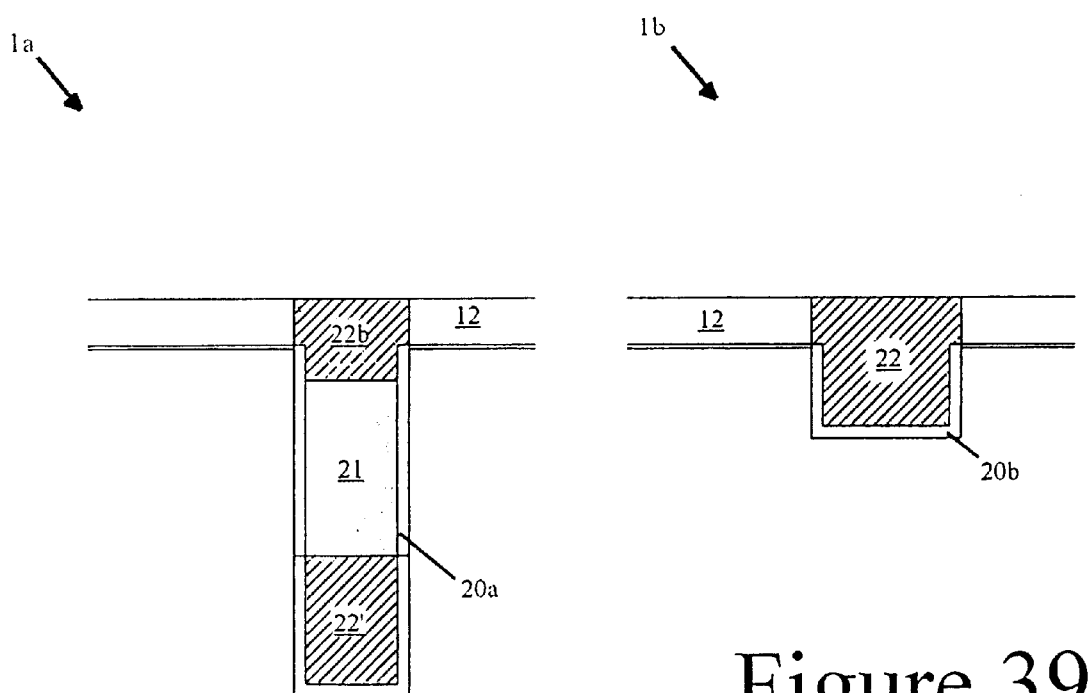
FIG. 39 shows the target structure formed by the second set of embodiments of the invention.

FIGS. 37 through 39 show one method in which the oxide fill 22 and conductive material fill 21' are planarized down to the pad nitride 12. This leaves conductive material only in the array trenches. An etch selective for the conductive material with respect to oxide and nitride is executed to recess the conductive material 21' into the array trenches to thereby create the conductive element 21, followed by deposition and planarization of a second oxide layer 22b to the level of the pad nitride layer 12.

As can be seen in the structure of FIG. 39, the resultant conductive element 21 is now raised to a higher position by the underlying oxide plug 22'. By this means, it is possible to control the vertical displacement of the conductive element. This is useful where the conductive element is to be used as a field shield and precise placement in relation to adjacent vertical devices is desired.

As with the other embodiment of the invention, a contact may be provided to the conductive element by the method described with reference to FIGS. 22 through 24.

Figure 40:
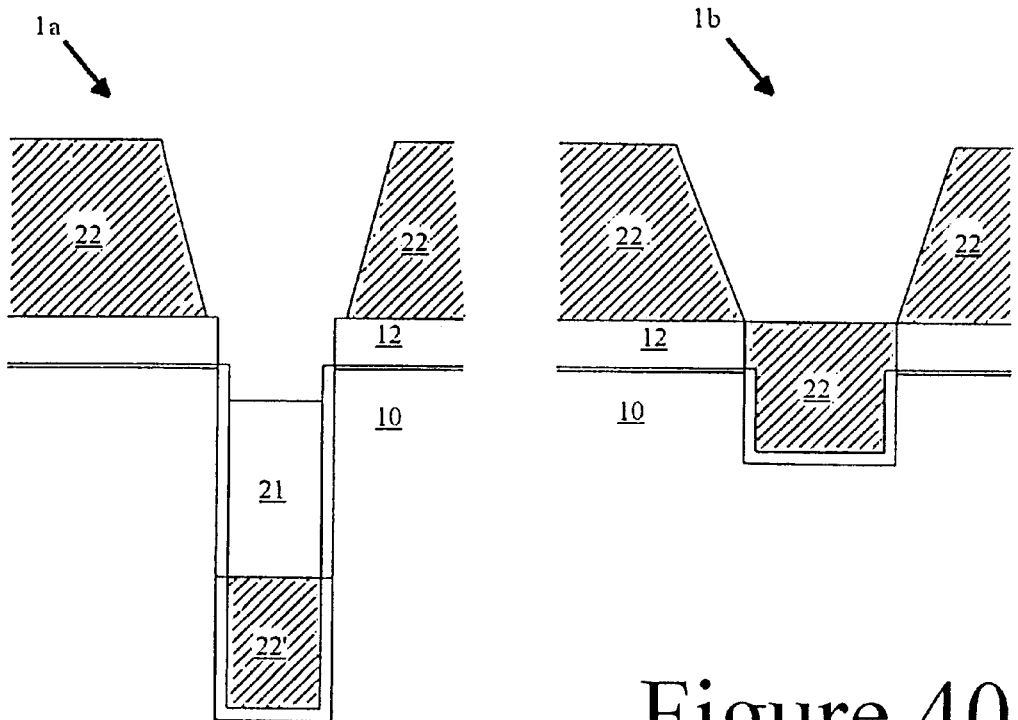
FIGS. 40 and 41 show a second embodiment of the second set of embodiments of the invention for obtaining the target structure depicted in FIG. 39.
Figure 41:
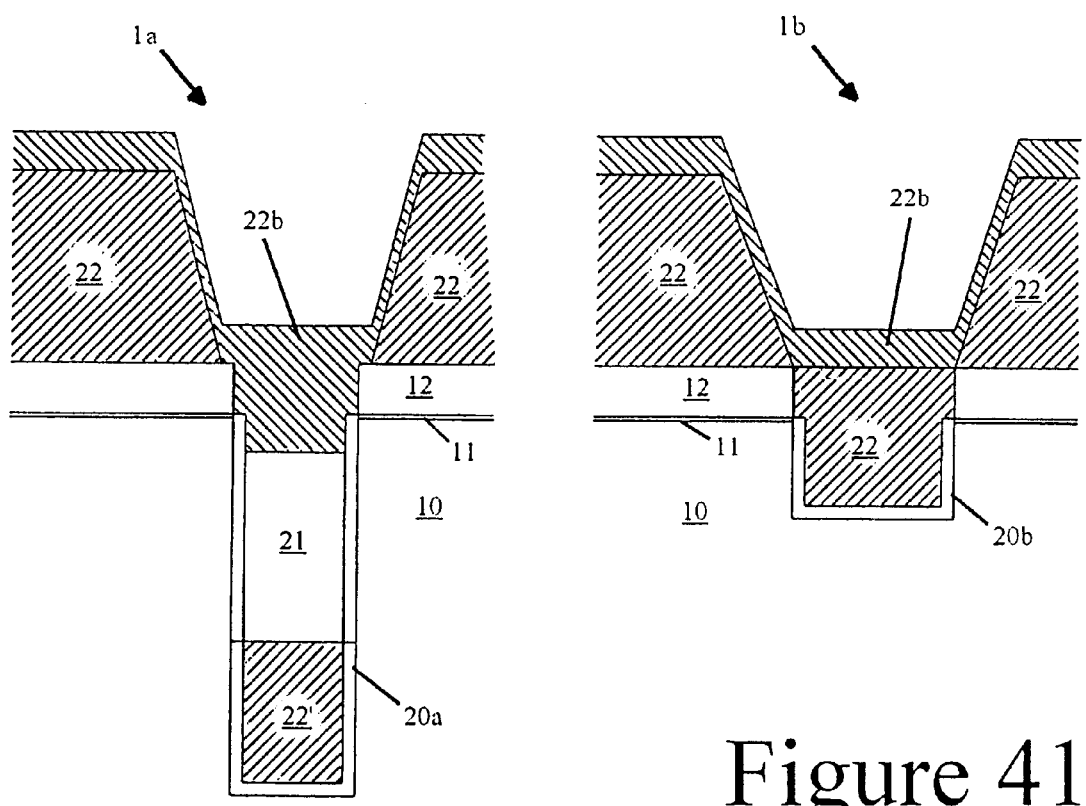

Referring to FIGS. 40 and 41, there is shown another method of getting from the structure of FIG. 36 to the target structure of FIG. 39. In this method, the conductive material fill 21' is first etched back to create the conductive element 21, followed by deposition of the second oxide layer 22b, which is then planarized down to the level of the pad nitride layer 12 so as to create the structure of FIG. 39. The advantage of this embodiment is that the planarization may be done with an oxide CMP, as opposed to the embodiment of FIG. 37 to 39 that would require an oxide/polysilicon CMP.

As can be seen, two sets of embodiments of the invention have been described. Both sets of embodiments use a conductive fill to control the simultaneous etching of support and array trenches to controllable depth.

Figure 10:
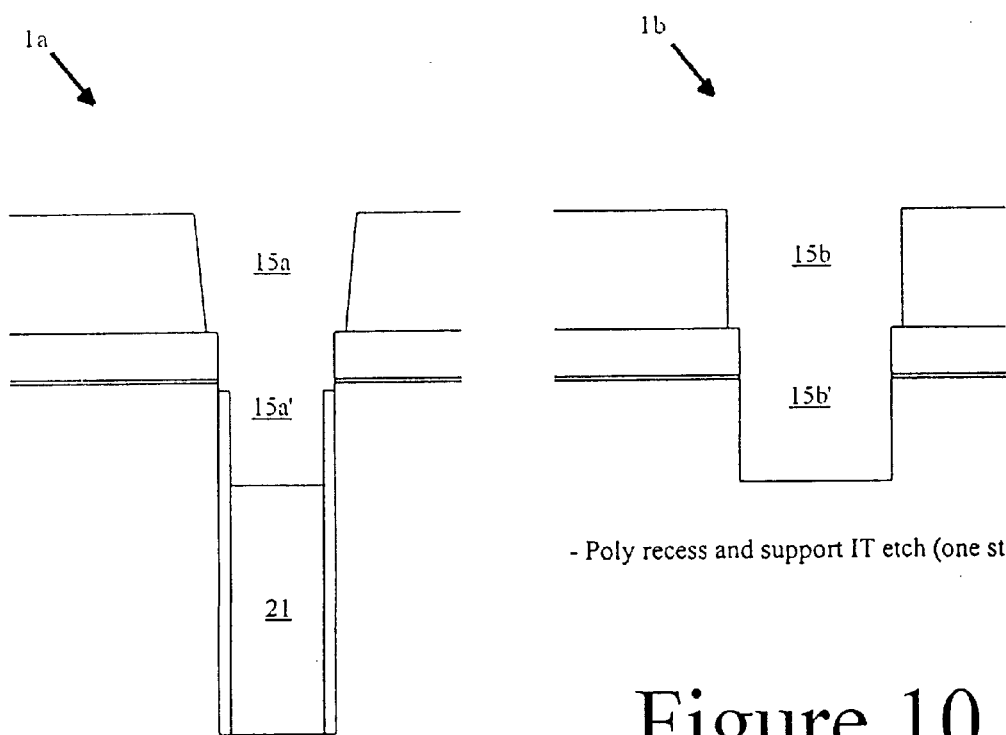

In the first set of embodiments (FIGS. 1 through 21), the conductive fill is chosen to be of substantially identical etch rate as the semiconductor substrate so that the top of the conductive element in the array trenches was at substantially the same depth as the bottom of the support trenches (FIGS. 10, 18). This permits subsequent oxide deposition into all the trenches to planarize more consistently across the entire surface of the wafer. Hence, subsequent depositions for additional structures will have a consistent foundation, thereby resulting in more predictable wafer manufacture and fewer defects.

In the second set of embodiments (FIGS. 28 through 41), the conductive fill need not be of a substantially identical etch rate with the semiconductor substrate, because the substrate is not simultaneously etched with the fill. Instead, the fill need only be selective to the etch with respect to the oxide layer 22. Hence, control of the etch is obtained by using the fill as an opportunity to planarize the fill 21' to the same layer as the oxide 22 across the entire wafer (FIG. 36). This permits control of the height of the conductive element without affecting the oxide fill in the support trenches, because the oxide fill is not affected by the conductive material etch.

In both sets of embodiments, the use of a wafer-wide conductive material fill allows simultaneous processing of both the array and support areas that nevertheless results in different structures for each area. After formation of trench isolations, except for forming the top contact for the field shields, CMOS and DRAM processing continues normally as is known in the art.

It is to be understood that all physical quantities disclosed herein, unless explicitly indicated otherwise, are not to be construed as exactly equal to the quantity disclosed, but rather as about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of simultaneously supplying trench isolations for array and support areas of a semiconductor substrate made of a substrate material, the method comprising:
   providing a first hard mask layer for the array and support areas, said first hard mask comprising mask openings defining trench isolations in the array and support areas;
   providing deep array trench isolations in the array areas;
   providing a blanketing planarized conductive material layer over both support and array areas sufficient to fill said mask openings and deep array trench isolations;
   etching said conductive material through said first hard mask material down into said semiconductor substrate so as to form support trench isolations, such that both deep array trench isolations and support trench isolations are of equal depth; and
   wherein a conductive element, comprising a quantity of said conductive material, remains in the bottom of each of said deep array trenches.

2. The method of claim 1 wherein said substrate material is silicon and said conductive material is polysilicon.

3. The method of claim 1 wherein said array area comprises vertical devices.

4. The method of claim 1, wherein said conductive element is in electrical contact with said semiconductor substrate.

5. The method of claim 1, wherein said conductive element is insulated from said semiconductor substrate.

6. The method of claim 5 wherein an electrical contact is provided to said conductive element.

7. The method of claim 1 further comprising providing an oxide insulator upon inner surfaces of said deep array trench isolations prior to providing said blanketing layer of conductive material.

8. The method of claim 7 further comprising providing an additional oxide insulator upon inner surfaces defined by said deep array trench isolations.

9. The method of claim 1, wherein said conductive element is a field shield.

10. The method of claim 9 wherein said field shield is biased.

11. A method of simultaneously supplying trench isolations for array and support areas of a semiconductor substrate made of a substrate material, the method comprising:
    providing deep array trench isolations in the array areas and support trench isolations in the support areas;
    providing an oxide plug within said deep array trench isolations;
    filling said support trench isolations with oxide;
    providing a blanketing planarized conductive material layer over both support and array areas sufficient to fill said array and deep array trench isolations;

planarizing said conductive material layer to a level substantially equal to said oxide mask;

etching said conductive material through said oxide mask material down into said semiconductor substrate so as to bring an upper surface of said conductive material within said deep trench isolations to a level below that of an upper surface of said oxide in said support trench isolations; and wherein a conductive element, comprising a quantity of said conductive material, remains in the bottom of each of said deep array trenches.

12. The method of claim 11 wherein said substrate material is silicon and said conductive material is polysilicon.

13. The method of claim 11 wherein said array area comprises vertical devices.

14. The method of claim 1 wherein said steps of providing an oxide plug within said deep array trench isolations and filling said support trench isolations with oxide is performed by a method comprising the steps of:

depositing a conformal layer of oxide over said array and support areas of sufficient depth to fill said support trench isolations; and etching back said conformal oxide layer to an extent effective in providing said oxide plug.

15. The method of claim 11, wherein said conductive element is insulated from said semiconductor substrate.

16. The method of claim 15 wherein an electrical contact is provided to said conductive element.

17. The method of claim 11 further comprising providing an oxide insulator upon inner surfaces of said deep array trench isolations prior to providing said blanketing layer of conductive material.

18. The method of claim 14 further comprising providing an oxide insulator upon inner surfaces of said deep array trench isolations prior to providing said conformal oxide layer.

19. The method of claim 11, wherein said conductive element is a field shield.

20. The method of claim 19 wherein said field shield is biased.

* * * * *

UNITED STATES PATENT AND TRADEMARK OFFICE
CERTIFICATE OF CORRECTION

PATENT NO.    : 6,566,228 B1
DATED         : May 20, 2003
INVENTOR(S)   : Jochen Beintner et al.

It is certified that error appears in the above-identified patent and that said Letters Patent is hereby corrected as shown below:

<u>Title page,</u>
Item [73], Assignee, please correct Assignees' name from "Infineon Technologies" to -- Infineon Technologies AG --.

Signed and Sealed this

Fifth Day of August, 2003

JAMES E. ROGAN
*Director of the United States Patent and Trademark Office*